United States Patent [19]

Tobita

[11] Patent Number: 5,548,596
[45] Date of Patent: Aug. 20, 1996

US005548596A

[54] SEMICONDUCTOR MEMORY DEVICE WITH READ OUT DATA TRANSMISSION BUS FOR SIMULTANEOUSLY TESTING A PLURALITY OF MEMORY CELLS AND TESTING METHOD THEREOF

[75] Inventor: Youichi Tobita, Hyogo-ken, Japan

[73] Assignee: Mitsubishi Denki Kabushiki Kaisha, Tokyo, Japan

[21] Appl. No.: 805,504

[22] Filed: Dec. 11, 1991

[30] Foreign Application Priority Data

Dec. 18, 1990 [JP] Japan ................ 2-403381

[51] Int. Cl.$^6$ .................................. G11C 29/00
[52] U.S. Cl. ................................. 371/21.2
[58] Field of Search ................ 371/21.4, 21.1, 371/27, 21.2–21.3, 21.5; 365/201, 189.04

[56] References Cited

U.S. PATENT DOCUMENTS

| | | | |
|---|---|---|---|
| 4,406,013 | 9/1983 | Reese et al. .................. | 377/29 |
| 4,520,483 | 5/1985 | Arita et al. ................... | 371/68.2 |
| 4,686,456 | 8/1987 | Furuyama et al. ............ | 324/73 R |
| 4,860,259 | 8/1989 | Tobita ........................... | 365/201 |
| 4,879,685 | 11/1989 | Takemae ....................... | 365/189.11 |
| 4,958,346 | 9/1990 | Fujisaki ........................ | 371/21.3 |
| 5,113,399 | 5/1992 | Woods et al. ................. | 371/21.3 |
| 5,148,398 | 9/1992 | Kohno .......................... | 365/201 |
| 5,216,678 | 6/1993 | Nawaki ......................... | 371/68.1 |
| 5,285,413 | 2/1994 | Miyauchi et al. ............. | 365/189.04 |

FOREIGN PATENT DOCUMENTS

3639169A1 7/1987 Germany.
1-169798 7/1989 Japan.
1-185896 7/1989 Japan.

OTHER PUBLICATIONS

"A 20–ns 4–Mb CMOS SRAM with Hierarchical Word Decoding Architecture", by Toshihiko Hirose et al., IEEE Journal of Solid–State Circuits, vol. 25, No. 5, Oct. 1990, pp. 1068–1073.

Kumanoya et al., "A 90ns 1Mb DRAM with Multi–Bit Test Mode", *1985 International Solid–State Circuits Conference*, pp. 240–241.

Nakagome et al., "A 1.5V Circuit Technology for 64 Mb DRAMs", *1990 Symposium on VLSI Circuits*, pp. 17–18.

*Primary Examiner*—Hoa T. Nguyen
*Attorney, Agent, or Firm*—Lowe, Price, LeBlanc & Becker

[57] ABSTRACT

The semiconductor memory device includes a read out data transmission line provided separately from a write data transmission line, a read out circuit including a differential amplifying circuit for amplifying a signal on the read out data transmission line, and a test circuit for comparing the signal potential on the read out data transmission line and a reference potential and detecting a defective bit. At the time of the normal mode, a memory cell of 1 bit is selected and the memory cell data of the selected 1 bit is transmitted to the read out data transmission line. At the time of the test mode, a plurality of memory cells are simultaneously selected and the simultaneously selected plurality of memory cell data are transmitted to the read out data transmission line. As a plurality of memory cells can be simultaneously tested using one pair of read out data transmission lines, the test time of the semiconductor memory device can be considerably reduced.

19 Claims, 16 Drawing Sheets

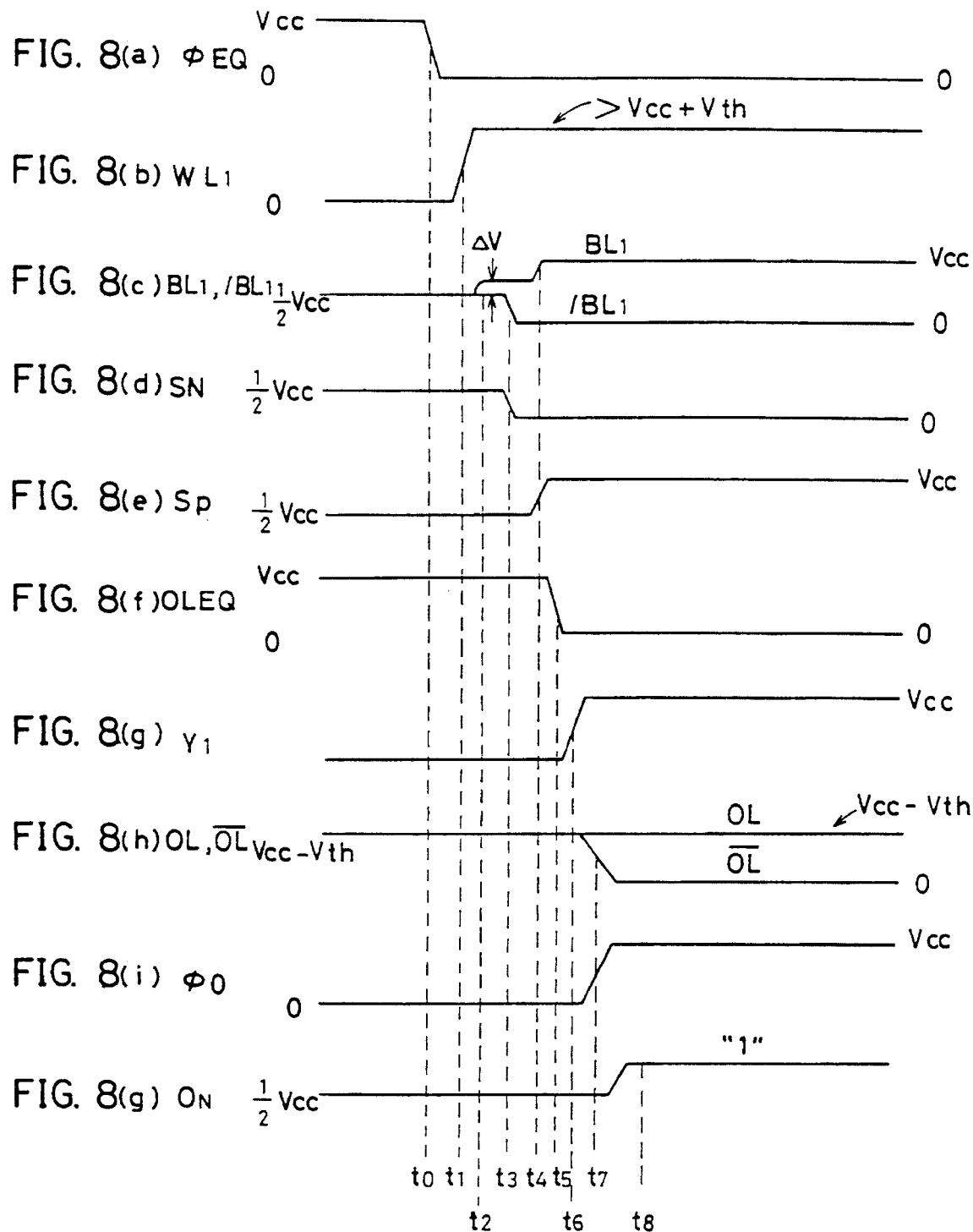

FIG. 9(a) OL      Vcc-Vth

FIG. 9(b) /OL     Vcc-Vth

FIG. 9(c) Vref    Vcc-Vth

FIG. 9(d) φ0      0                                  Vcc

FIG. 9(e) OT      ½Vcc                        "1"

FIG. 9(f) /OT     ½Vcc                        "0"

FIG. 9(g)         DON'T CARE                  "1"

t6 t7  t8

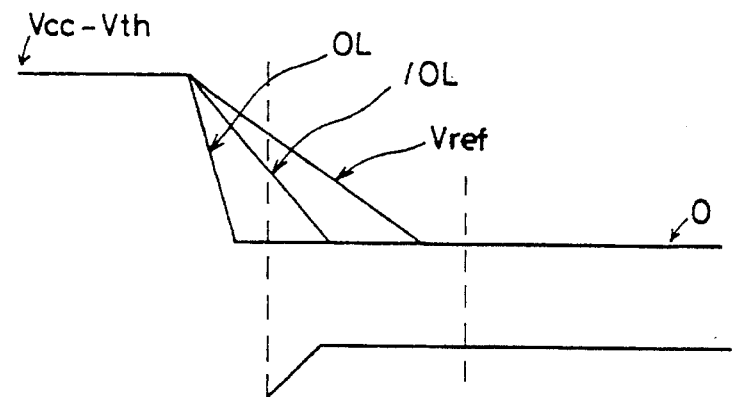
FIG. 10(a) OL /OL Vref
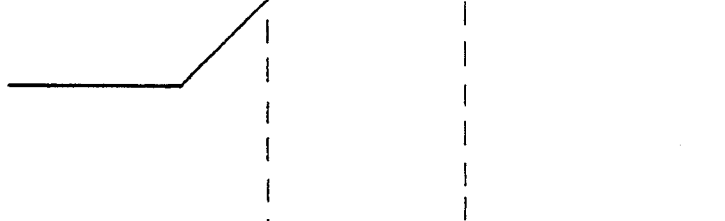
FIG. 10(b) φ0
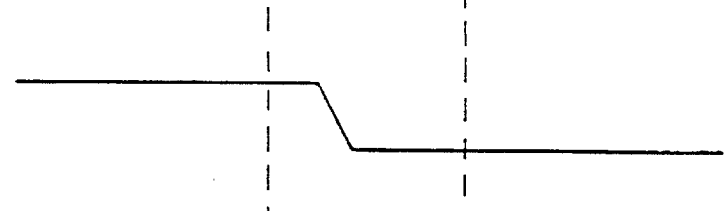
FIG. 10(c) OT
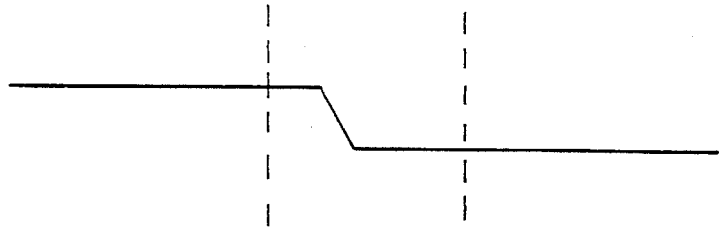
FIG. 10(d) /OT
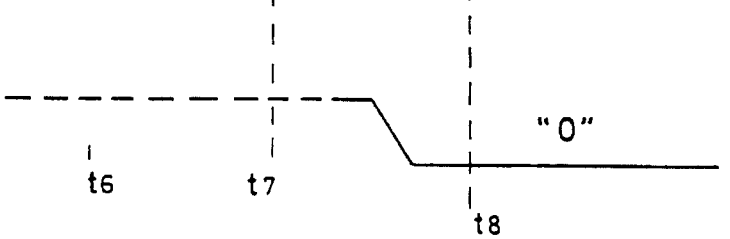
FIG. 10(e) OUTPUT

5,548,596

SEMICONDUCTOR MEMORY DEVICE WITH READ OUT DATA TRANSMISSION BUS FOR SIMULTANEOUSLY TESTING A PLURALITY OF MEMORY CELLS AND TESTING METHOD THEREOF

BACKGROUND OF THE INVENTION

1. Field of the Invention

The invention relates generally to semiconductor memory devices and, more particularly, relates to structures for shortening the testing time thereof.

2. Description of the Background Art

With development of semiconductor techniques, storage capacity of semiconductor memory devices has been remarkably increased. The storage capacity has been rapidly increased by four times about every three years. Such semiconductor memory devices, from the point of view of quality assurance, require a test to see if they operate normally after being manufactured. A time period (testing time) required for this test has been sharply (exponentially) increased with the increase in the storage capacity of semiconductor memory devices. The increase in the testing time causes an increase in the cost not only of a semiconductor memory device itself but also of a system employing the same. Therefore, the introduction of techniques for shortening the testing time becomes essential and indispensable. A multibit parallel testing scheme is one of such testing time shortening techniques, in which memory cells of a plurality of bits are simultaneously tested.

FIG. 1 is a diagram schematically showing the overall structure of a conventional semiconductor memory device with a multibit parallel testing function. In FIG. 1, the conventional semiconductor memory device includes a memory cell array 100 including a plurality of memory cells arranged in a matrix of rows and columns, an address buffer 102 for receiving an externally applied address A0 to An and generating an internal address, a row decoder 104 for selecting a corresponding row of memory cell array 100 in accordance with an internal row address from address buffer 102, a column decoder 106 responsive to an internal column address from address buffer 102 for generating a signal for selecting a corresponding column of memory cell array 100, and an I·O gate 110 responsive to a column select signal from this column decoder 106 for connecting the selected column within memory cell array 100 to a common data bus 108.

Memory cell array 100 is divided into four blocks MB1, MB2, MB3 and MB4. 1 bit from each of the memory cell blocks MB1 to MB4, i.e., memory cells of 4 bits in total are simultaneously selected and connected to common data bus 108. Row decoder 104 selects one row from each of memory cell blocks MB1 to MB4. Column decoder 106 generates a column select signal for selecting one column from each of memory cell blocks MB1 to MB4. Common data bus 108 includes four data bus lines 108a, 108b, 108c and 108d provided corresponding to each memory cell block so as to transmit data of 4 bits in parallel.

The semiconductor memory device further includes a write circuit 112 which is activated in response to an internal write instructing signal W at the time of writing data, for receiving externally applied write data Din and generating internal write data, a block decoder 114 for decoding a block designation signal from address buffer 102 and selecting one block of memory cell blocks MB1 to MB4, a read out circuit 116 for receiving read out data from the memory cell block selected by this block decoder 114 and generating external read out data Dout, and a test circuit 118 for simultaneously receiving memory cell data of 4 bits read on the common data bus 108, effecting a predetermined operational processing on the same, and generating a signal indicating whether or not the memory cells of 4 bits are normal.

Test circuit 118 is activated in response to a test mode instructing signal T and carries out a prescribed operational processing with respect to the data of 4 bits on common data bus 108. Read out circuit 116 is set to an output high impedance state at the time of the test mode in response to an inverted signal /T of the test mode instructing signal. Block decoder 114 connects internal data bus 120 to four common data bus lines 108a to 108d in response to a logical product signal W·T of an internal write instructing signal W indicating data writing at the time of the test mode and a test mode instructing signal T. Data writing is carried out on a 4-bit basis at the time of the test mode. This semiconductor memory device has a ×1 bit structure in which input/output of data is carried out on a 1-bit basis. The operation thereof will now be described.

The operation at the time of a normal mode will be described. Address buffer 102 generates an internal row address and an internal column address in response to an externally applied address A0 to An. Row decoder 104 decodes this internal row address and selects one row from each of memory cell blocks MB1 to MB4 of memory cell array 100. Column decoder 106 receives and decodes an internal column address except, for example, 2 least significant bits therein and generates a signal for selecting one column from each of memory cell blocks MB1 to MB4. I·O gate 110 connects one column from each of memory cell blocks MB1 to MB4 to common data bus lines 108a to 108d, respectively, in response to the column select signal from column decoder 106. As a result, the memory cells of 4 bits selected by row decoder 104 and column decoder 106 are connected to common data bus lines 108a to 108d.

At the time of writing data, write circuit 112 is activated in response to the internal write instructing signal W, generates internal write data from the externally applied write data Din and transmits the same to internal data bus 120. Block decoder 114 decodes a block address including, for example, 2 least significant bits in the internal column address from address buffer 102 and connects one of the data bus lines 108a to 108d to internal data bus 120. As a result, data is written into a memory cell of the block designated by block decoder 114 among the simultaneously selected memory cells of 4 bits.

At the time of reading data, the internal write instructing signal W is in an inactive state and write circuit 112 is brought to an output high impedance state. Read out circuit 116 amplifies read out data transmitted from one common data bus line selected by the block decoder 114 and generates external read out data Dout. As a result, reading of data of a memory cell of 1 bit is completed. This read out circuit 116 may operate at the time of data writing or it may be set to an output disable state or a high impedance state at the time of data writing. As for test circuit 118, at the time of a normal operation mode, the test mode instructing signal T is in an inactive state and the output thereof is set to a high impedance state.

The operation at the time of the test mode will now be described. At the time of the test mode, external write data Din of a predetermined logical value ("1" or "0") is applied. The internal write data generated from write circuit 112 at the time of the test mode is applied to block decoder 114.

Block decoder 114 transmits data on the internal data bus 120 onto the four common data bus lines 108a to 108d in response to the signal W·T in an active state. As a result, the same data is simultaneously written into the memory cells of 4 bits which have been selected in the same way at the time of the normal operation mode. When this operation is carried out with respect to all the memory cells within memory cell array 100, the same data is written into all the memory cells of memory cell array 100.

In the functional test of the semiconductor memory device, a test is conducted to see if each memory cell within memory cell array 100 exactly holds the applied data.

After writing of the same data into all the memory cells within memory cell array 100 is completed, in the same way as at the time of the normal operation mode, data of memory cells of 4 bits is read out from each of memory cell blocks MB1 to MB4 and transmitted onto the four common data bus lines 108a to 108d. Test circuit 118 is activated in response to the test mode instructing signal T, effecting a prescribed operational processing on the memory cell data of 4 bits on the common data bus lines 108a to 108d and supplies a signal indicating the result of the processing. The output from test circuit 118 is provided as external data Dout. A defective bit (for example, inversion of the stored data) and so on in the semiconductor memory device is detected by monitoring the external data Dout on the outside.

At the time of the test mode, read out circuit 116 is set to the output high impedance state in response to the inverted signal /T. In the structure shown in FIG. 1, there may be a multiplexer for receiving the outputs of test circuit 118 and read out circuit 116, selectively passing either of them in response to the test mode instructing signal T and supplying external data Dout. A variety of operational functions conducted by test circuit 118 have been proposed.

FIG. 2 is a diagram schematically showing the structure of a test circuit 118 for implementing a test function of "1/0/Hi-Z" scheme. In FIG. 2, test circuit 118 includes an AND type gate circuit G1 for receiving data D0 to D3 of 4 bits on a common data bus 108 and receiving a test mode instructing signal T, an inverter circuit G2 for inverting the test mode instructing signal T, an NOR type gate circuit G3 for receiving the data D0 to D3 of 4 bits on common data bus 108 and the output of inverter circuit G2, a first output transistor OT1 for receiving the output of gate circuit G1 at its gate, and a second output transistor OT2 for receiving the output of gate circuit G3 at its gate.

Gate circuit G1 supplies a signal of "H" when all the applied signals are at "H". Gate circuit G3 supplies a signal of "H" when all the applied signals are at "L". Output transistors OT1 and OT2 each are turned on when a signal applied to the gate attains "H". First output transistor OT1 charges the output node NA to "H" of the operating power supply potential Vcc when it is turned on. The second output transistor OT2 discharges the output node NA to "L" level of the potential Vss level being the ground potential, for example, when it is turned on. Let the potential "H" correspond to logic "1" and potential "L" correspond to logic "0". The operation of test circuit 118 shown in FIG. 2 will now be described.

At the time of the test mode, the test mode instructing signal T is set to "H" and the output of inverter circuit G2 attains "L". When all the read out data D0 to D3 of 4 bits are at logic "1", the output potential of gate circuit G1 attains "H" and the output potential of gate circuit G3 attains "L". The first output transistor OT1 is turned on, the second output transistor OT2 is turned off, and the output node NA is charged to the potential "H". As a result, output data Dout of logic "1" is obtained.

When all the read out data D0 to D3 of 4 bits are at logic "0", the output potential of gate circuit G1 attains "L", and the output potential of gate circuit G3 attains "H". The first output transistor OT1 is thereby turned off, the second output transistor OT2 is turned on, the output node NA is discharged to "L" of the potential Vss level and output data Dout of logic "0" is generated.

When the 4 bit memory cell data D0 to D3 includes data of logic "0" and "1" in a mixed manner, the output potentials of gate circuits G1 and G3 both attain "L". In this case, output transistors OT1 and OT2 are both turned off and the output node NA is brought to a high impedance state. The same data has been written into all the memory cells within memory cell array 100. Accordingly, if there is a defective bit in the simultaneously selected memory cells of 4 bits, the output data Dout is brought to the high impedance state. If the logical values of the memory cell data D0 to D3 of 4 bits coincide with each other, output data Dout of the same logical value as that of this memory cell data is obtained. If the data D0 to D3 of the simultaneously selected memory cells of 4 bits all have the logic inverted with respect to that of the write data, the output data Dout takes a logical value opposite to an expected value (data to be read out) and the defect can be detected.

FIG. 3 is a diagram schematically showing a test circuit having a test function according to a "coincidence/non-coincidence" scheme. In FIG. 3, a test circuit 118 includes a coincidence detection circuit G4 for receiving read out data D0 to D3 of 4 bits and a transmission gate TM which is turned on in response to a test mode instructing signal T, for passing the output of coincidence detection circuit G4. In the structure of test circuit 118 shown in FIG. 3, if all the logical values of the read out data D0 to D3 of 4 bits coincide with each other, logic "1" is supplied from coincidence detection circuit G4. The 4 bit read out data D0 to D3 includes data of logic "1" and "0" in a mixed manner, logic "0" is supplied from coincidence detection circuit G4.

Data of the same logic has been written into the all the memory cells in memory cell array 100. Therefore, if the output data Dout attains logic "0", it means a malfunction of the semiconductor memory device.

A specific example of a structure for shortening the testing time of a semiconductor memory device can be found, for example, in M. Kumanoya, "A 90 ns 1 Mb DRAM with multi-bit test mode", 1985 IEEE, ISSCC, Digest of Technical Papers, p240. The article by Kumanoya discloses a method of simultaneously testing memory cells of 4 bits in a dynamic random access memory (DRAM) of an address multiplexing scheme with 1M (mega) word ×1 bit structure.

While a parallel test of memory cells of 4 bits is shown in the description of the above-mentioned prior art, this method can be basically extended to a method of simultaneously testing more memory cells. For this extension, however, it is necessary to provide the same number of common data bus lines as that of memory cells to be simultaneously tested. Normally, an amplifying circuit such as a preamplifier for amplifying a signal potential is provided for the common data bus lines. Therefore, in order to simultaneously test as many memory cells as possible for reducing the testing time, it is necessary to add common data bus lines and amplifying circuits, causing a problem of an increase in the chip area and the power consumption.

Other than a semiconductor memory device in which input/output of data is carried out through common data bus lines, there is a semiconductor memory device in which a data write bus and a data read bus are provided separately in order to read out data at high speed. Even in this separated I/O structure type memory device, a read out data amplifying circuit is also provided for the data read out bus and the same problem as described above is caused. One example of an I/O separate-type semiconductor memory device is described in Y. Nakagome et al., "A 1.5 V Circuit Technology for 64 Mb DRAMs", IEEE, the precedings of 1990 Symposium on VLSI circuits, pp. 17–18, Feb. 1990.

Considering all of the testing time and the chip area and power consumption, practically, memory cells of 4 bits in a DRAM of 1M bits, memory cells of 8 bits in a DRAM of 4M bits, and memory cells of 16 bits in a DRAM of 16M bits are generally tested simultaneously. As seen from the relationship between the storage capacity of the semiconductor memory device and the number of bits of memory cells to be simultaneously tested, practically, it is difficult to linearly increase the number of memory cells to be simultaneously tested in proportion to the increase in the storage capacity, and the testing time has been disadvantageously increased sharply with the increase in the storage capacity. For example, while the storage capacity of a DRAM of 16M bits is 16 times as large as that of a DRAM of 1M bits, the number of memory cells which can be simultaneously tested is only increased by 4 times. Accordingly, if simply calculated, the testing time of the DRAM of 16M bits is about 4 times as long as that of the DRAM of 1M bits.

SUMMARY OF THE INVENTION

Therefore, an object of the present invention is to provide a semiconductor memory device the testing time for which can be reduced.

Another object of the present invention is to provide semiconductor memory device in which a multiplicity of memory cells can be simultaneously tested without increasing the chip area and power consumption.

A semiconductor memory device according to the present invention includes a memory cell array including a plurality of memory cells arranged in a matrix of rows and columns, and a read out data transmission line for transmitting data read out from a selected memory cell within the memory cell array.

The semiconductor memory device according to the present invention further includes read out circuitry responsive to an address when operating in a test mode for selecting a plurality of memory cells from the memory cell array and transmitting data of the selected plurality of memory cells to one read out data transmission line at the same time, and determination circuitry responsive to a signal potential on the read out data transmission line for determining whether or not there is a defective bit in the above-mentioned plurality of memory cells simultaneously selected.

At the time of the test mode, the data of the plurality of memory cells is simultaneously transmitted onto the one read out data transmission line. The signal potential on the read out data transmission line changes in accordance with storage data of the simultaneously selected plurality of memory cells. The determination circuitry determines whether or not there is a defective bit in the simultaneously selected plurality of memory cells in accordance with the relationship between a reference potential and the signal potential on the read out data transmission line.

At the time of the normal mode, data of one memory cell selected from the memory cell array is transmitted to the read out data transmission line. As a result, it is possible to determine good/defective of the plurality of memory cells at the same time without adding an extra read out data transmission line.

An arbitrary number of memory cells can be simultaneously selected at the time of the test mode by switching the number of memory cells to be selected between the normal mode and the test mode, and the number of memory cells to be tested at the same time can be easily increased.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a signal waveform diagram showing the operation of reading data at the time of the normal mode operation of the semiconductor memory device shown in FIGS. 4 to 7.

FIG. 9 is a signal waveform diagram showing the operation when there is no defective bit in determining the presence/absence of a defective bit at the time of the test mode operation of the semiconductor memory device shown in FIGS. 4 to 7.

FIG. 10 is a signal waveform diagram showing a determining operation when there is a defective bit at the time of the test mode operation.

FIG. 1i is a diagram showing the structure of a unit column decoder circuit included in a column decoder.

DESCRIPTION OF THE PREFERRED EMBODIMENTS

Figure 4:
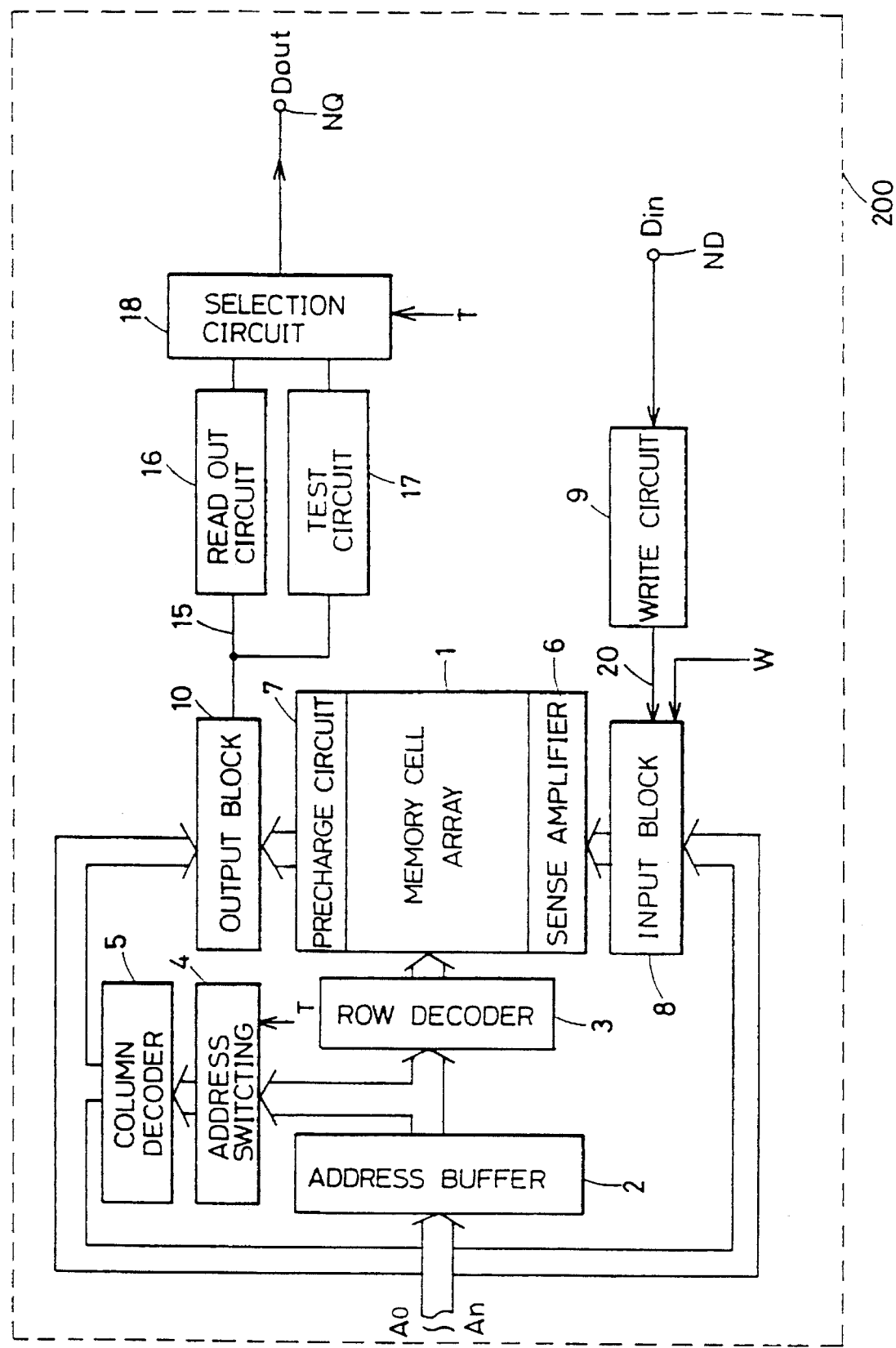
FIG. 4 is a diagram showing the overall structure of a semiconductor memory device according to one embodiment of the present invention.

FIG. 4 is a diagram schematically showing the overall structure of a semiconductor memory device according to one embodiment of the present invention. In FIG. 4, a semiconductor memory device 200 includes a memory cell array 1 including a plurality of memory cells arranged in a matrix of rows and columns, an address buffers 2 for receiving an externally applied address A0 to An and generating an internal address, a row decoder 3 for decoding the internal row address from address buffer 2 and selecting one row of memory cell array 1, an address switching circuit 4 responsive to a test mode instructing signal T for switching an internal column address from address buffer 2 into a block designating address and a column designating address, and a column decoder 5 for decoding an address from address switching circuit 4 and generating a signal for selecting one column or a plurality of columns of memory cell array 1.

While this semiconductor memory device is shown, having a ×1 bit structure in which input/output of data is carried out on a 1-bit basis, the present invention can be also applied to a semiconductor memory device for inputting/outputting data on a basis of a plurality of bits. In the case of the structure in which inputting/outputting of data is carried out on a basis of a plurality of bits, a plurality of blocks are provided with memory cell array 1 being one block. The structure of the semiconductor memory device in which data is inputted/outputted on the basis of the plurality of bits can be easily obtained by adding a structure where each block is accessed in parallel.

Address switching circuit 4 changes all the prescribed least significant bits in the column address from address buffer 2 to a value indicating a selected state and supplies the same to column decoder 5 when the test mode instructing signal T is in an active state indicating the test mode operation. Therefore, at this time, the address signal from address switching circuit 4 is a signal indicating one column group in memory cell array 1. When this test mode instructing signal T is in an inactive state, indicating the normal mode operation, address switching circuit 4 transmits the internal column address from address buffer 2, as received, to column decoder 5. Accordingly, in this case, column decoder 5 generates a signal for selecting one column of memory cell array 1.

The structure may be such that the test mode instructing signal T is provided through a pin terminal from outside of semiconductor memory device 200 or it may be generated by a prescribed combination of timings of control signals employed in a normal DRAM, for example, /RAS, /CAS, and /WE. The structure in which the test mode instructing signal T is generated by setting the timing of the control signals /RAS, /CAS and /WE has been known, for example, as a WCBR (WE and CAS before RAS) scheme.

In the structure stated above, at the time of the normal operation mode, a memory cell of 1 bit in memory cell array 1 is selected by row decoder 3 and column decoder 5 with an address from address buffer 2. Address buffer 2, row decoder 3 and column decoder 5 form first reading means. At the time of the test mode operation, column decoder 5 simultaneously selects a plurality of columns by the function of address switching circuit 4. Accordingly, address buffer 2, row decoder 3, address switching circuit 4 and column decoder 5 constitute second reading means.

Address buffer 2 generates an internal row address and an internal column address from an external address A0 to An. The structure may be such that the timing of generating an internal address is given by a row address strobe signal /RAS and a column address strobe signal /CAS in the same way as in a DRAM of a conventional multiplexed address scheme. The structure may be such that an internal row address and an internal column address are simultaneously generated using a chip enable signal /CE or a chip select signal /CS as in a DRAM of a non-multiplexed address scheme. The address at the time of the test mode may be sequentially generated by a counter, for example, inside the device or may be externally applied.

This semiconductor memory device further includes a sense amplifier circuit 6 for detecting and amplifying data of memory cells of one row selected by row decoder 3 within memory cell array 1, a precharge circuit 7 for precharging each column (bit line pair) within memory cell array 1 to a prescribed potential at the time of standby, and an input block 8 which is activated in response to an internal write instructing signal W, for transmitting an internal write data from a write circuit 9 onto a column selected by column decoder 5 within memory cell array 1. Write circuit 9 generates internal write data from write data Din supplied to the node ND. The node ND may be, directly or through an input buffer, connected to an external input terminal. The structure of input block 8 will be described later in detail.

Semiconductor memory device 200 further includes an output block 10 responsive to a column (or block) select signal from column decoder 5 for reading data of a memory cell on a corresponding column within memory cell array 1 and transmitting the same to a read out data transmission line 15, a read out circuit 16 for amplifying and supplying internal read out data on the read out data transmission line 15, a test circuit 17 for generating a signal determining good/defective of a plurality of memory cells simultaneously selected within memory cell array 1 based on the internal read out data on read out data transmission line 15 and a reference potential (not shown in FIG. 4), and a selection circuit 18 responsive to the test mode instructing signal T for selectively passing either one of the output of read out circuit 16 and the output of test circuit 17 and supplying the same to the node NQ.

This node NQ may be adapted to be directly connected to the external output terminal or maybe adapted to be connected to the external output terminal through an output buffer. It may be so structured that the output data Dout and the write data Din are outputted and inputted through the same external pin terminal or they are inputted/outputted through separate pin terminals.

Output block 10 transmits data of one memory cell within memory cell array 1 to the read out data transmission line in response to a column select signal from column decoder 5 at the time of the normal mode operation. At the time of the test mode operation, output block 10 transmits data of a plurality of memory cells to the read out data transmission line 15 at the same time according to a block select signal from column decoder 5. The structure of each circuit will now be specifically described.

Figure 5:
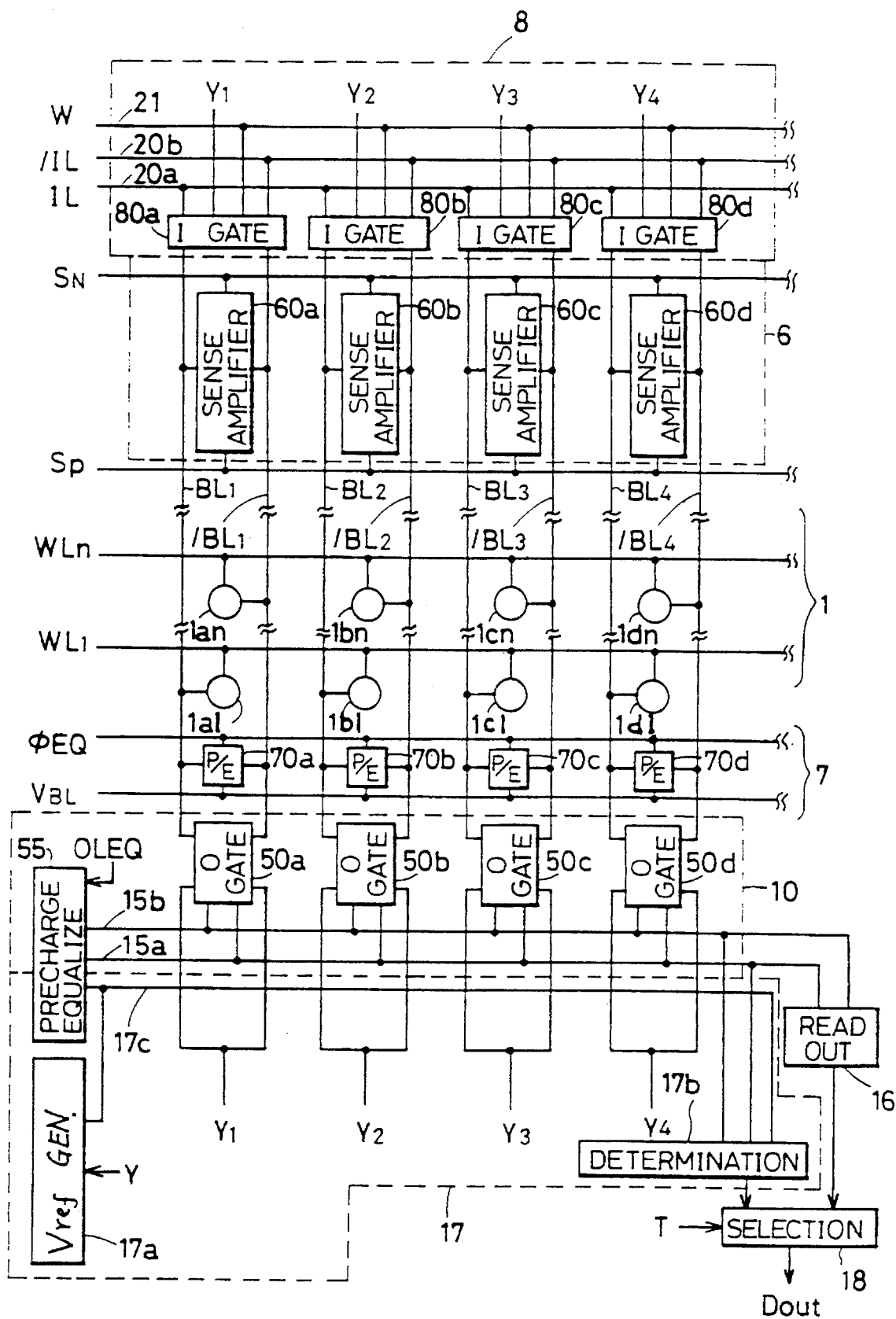
FIG. 5 is a diagram showing the structure of the main portion of the semiconductor memory device shown in FIG. 4.

FIG. 5 is a diagram showing the structure of the main portion of the semiconductor memory device shown in FIG. 4. In FIG. 5, memory cell array 1 includes a plurality of word lines WL1 to WLn each having memory cells of one row connected thereto and pairs of bit lines BL, /BL to each of which memory cells of one column are connected. Bit line BL and bit line /BL are disposed as a pair and signals complementary to each other are transmitted thereon. In FIG. 5, two word lines WL1 and WLn and four pairs of bit lines BL1, /BL1, BL2, /BL2, BL3, /BL3 and BL4, /BL4 are representatively shown.

One row of memory cells 1an, 1bn, 1cn, . . . 1dn are connected to word line WLn. Memory cells 1a1, 1b1, 1c1, . . . 1d1 are connected to word line WL1. Memory cells 1a1 to 1an are connected to bit line pair BL1, /BL1. Memory cells 1b1 to 1bn are connected to bit line pair BL2, /BL2. One column of memory cells 1c1 to 1cn are connected to bit line pair BL3, /BL3. One column of memory cells 1d1 to 1dn are connected to bit line pair BL4, /BL4. One memory cell is located corresponding to an intersection of one pair of bit lines BL, /BL and one word line WL. Therefore, in one pair of bit lines BL, /BL, data of the memory cell is transmitted to one bit line and the other bit line is maintained at the reference potential.

Sense amplifier circuit 6 includes sense amplifiers 60a, 60b, 60c and 60d provided for each bit line pair BL1, /BL1 to BL4, /BL4. The sense amplifiers 60a to 60d are activated in response to sense amplifier activation signals SN and SP and differentially amplify a signal potential of a corresponding bit line pair.

An input block 8 includes input gates (I gates) 80a, 80b, 80c and 80d provided corresponding to each bit line pair BL1, /BL1 to BL4, /BL4, which are turned on in response to a column select signal Yj (j=1 to 4) from a column decoder 5 (not shown in FIG. 5) and an internal write instructing signal W transmitted through a signal line 21, for transmitting data on write data transmission lines 20a and 20b to a corresponding bit line. Internal write data IL and /IL complementary to each other are transmitted from write circuit 9 shown in FIG. 4 to write data transmission lines 20a and 20b.

Precharge circuit 7 includes precharge/equalize circuits 70a, 70b, 70c and 70d provided corresponding to bit line pairs BL1, /BL1 to BL4, /BL4, for precharging and equalizing a corresponding bit line pair to a prescribed precharge potential VBL in response to a precharge/equalize instructing signal φEQ. The precharge potential VBL is generally set to ½ of the operation power supply potential Vcc.

Output block 10 includes output gates (O gates) 50a, 50b, 50c and 50d provided corresponding to bit line pairs BL1, /BL1 to BL4, /BL4, which are turned on in response to a column select signal Yj from column decoder 5 (see FIG. 4), for amplifying the potential on a corresponding bit line pair and transmitting the same to read out data transmission lines 15a and 15b. The read out data transmission line 15a and the read out data transmission line 15b are disposed as a pair and transmit read out data complementary to each other. Output block 10 further includes a second precharge/equalize circuit 55 which is activated in response to an output precharge instructing signal OLEQ, for precharging read out data transmission lines 15a and 15b to a precharge potential being the operation power supply potential Vcc, for example, and equalizing the potentials of read out data transmission lines 15a and 15b.

Test circuit 17 includes a reference potential generating circuit (Vref generating circuit) 17a responsive to a control signal Y generated at the same timing as the column select signal Yj for generating a prescribed reference potential Vref and transmitting the same to a reference potential transmission line 17c, and a determination circuit 17b for receiving a signal potentials on read out data transmission lines 15a and 15b and the potential on reference potential transmission line 17c and determining if there is a defect in the simultaneously selected plurality of memory cells according to the relationship between the received signal potentials. Second precharge/equalize circuit 55 includes a circuit portion responsive to an output precharge instructing signal OLEQ for precharging and equalizing reference potential transmission line 17c to the same potential as those of read out data transmission lines 15a and 15b. In FIG. 5, second precharge/ equalize circuit 55 is shown being shared by output block 10 and test circuit 17.

Figure 6B:
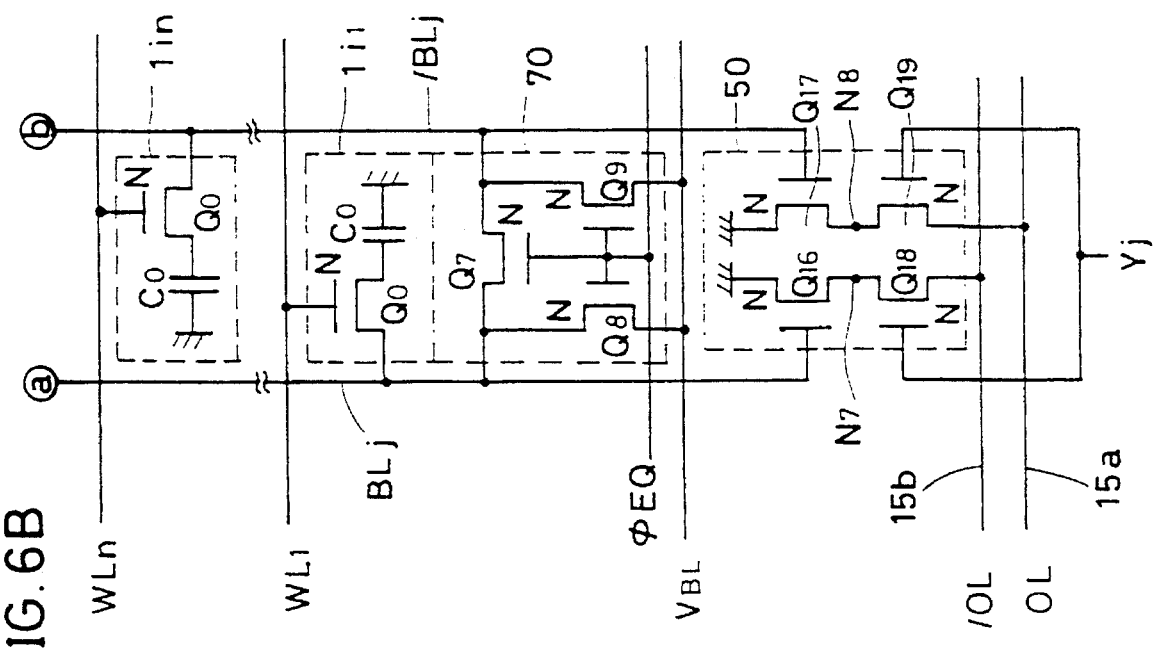
FIGS. 6A and 6B are diagrams specifically showing the structure of a circuit related to a pair of bit lines shown in FIG. 5.
Figure 6A:
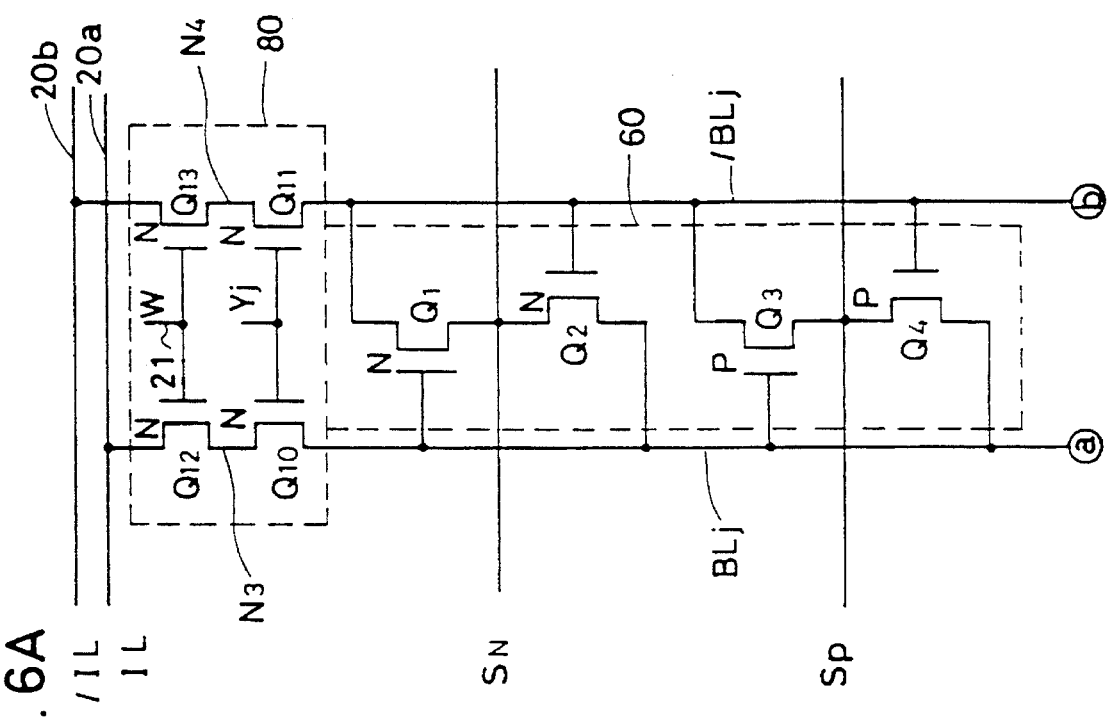

FIGS. 6A and 6B are diagrams more specifically showing the structure of circuitry related to a pair of bit lines BLj, /BLj (j=1 to 4) shown in FIG. 5. In FIG. 6A, an input gate (I gate) 80 includes n channel MOS transistors (insulated gate field effect transistors) Q12 and Q13 which are turned on in response to an internal write instructing signal W, for transmitting internal write data IL and /IL on write data transmission lines 20a and 20b to nodes N3 and N4, respectively, and n channel MOS transistors Q10 and Q11 which are turned on in response to a column select signal Yj from column decoder 5 (see FIG. 4), for transmitting signal potentials on nodes N3 and N4 to bit lines BLj and /BLj, respectively.

Accordingly, input gate 80 transmits the internal write data IL and /IL on write data transmission liens 20a and 20b to corresponding bit lines BLj and /BLj only when the internal write instructing signal W and the column select signal Wj are both brought to an active state of "H". Input gate 80 representatively indicates input gates 80a to 80d and an accompanying small letter for each circuit portion will be also omitted in the descriptions below.

A sense amplifier 60 includes n channel MOS transistors Q1 and Q2 which are activated in response to a first sense amplifier activation signal SN for discharging the bit line of lower potential of corresponding bit lines BLj and /BLj to "L" of the potential Vss level, and p channel MOS transistors Q3 and Q4 which are activated in response to a second sense amplifier activation signal SP, for increasing the potential of the bit line of higher potential of corresponding bit lines BLj and /BLj to the operation power supply potential Vcc level. Transistor Q1 has the gate connected to bit line BLj and the drain connected to the complementary bit line /BLj and the source coupled to receive the first sense amplifier activation signal SN. Transistor Q2 has the gate connected to the complementary bit line /BLj and the drain connected to bit line BLj and the source coupled to receive the first sense amplifier activation signal SN.

Transistor Q3 has the gate connected to bit line BLj and the source connected to the complementary bit line /BLj, and receives the second sense amplifier activation signal SP at its drain. Transistor Q4 has the gate connected to the complementary bit line /BLj and the source connected to bit line BLj and the second sense amplifier activation signal SP is applied to the drain thereof. When sense amplifier 60 is to operate, the first sense amplifier activation signal SN falls to "L" and the second sense amplification activation signal SP rises to "H". The first and second sense amplifier activation signals SN and SB, when being inactive, are held at Vcc/2 level which is same as the bit line precharge potential in this embodiment.

Memory cells 1in and 1i1 in FIG. 6B both have a structure of 1 transistor and 1 capacitor type and include a memory capacitor CO for storing information in the form of electric charge and a transfer gate transistor Q0 which is turned on in response to the signal potential on a corresponding word line, for connecting the memory capacitor CO to a corresponding bit line. Memory cell 1in transmits the stored data to the complementary bit line /BLj when word line WLn is selected. Memory cell 1i1 transmits the stored data to bit line BLj when word line WL1 is selected.

A precharge circuit 70 for bit lines includes an n channel MOS transistor Q7 which is turned on in response to a bit line precharge instructing signal φEQ, for electrically short-circuiting bit line BLj and bit line /BLj, and n channel MOS transistors Q8 and Q9 responsive to the bit line precharge instructing signal φEQ for transmitting a prescribed precharge potential VBL to bit lines BLj and /BLj, respectively. The precharge/equalize circuit 70 for bit lines causes bit lines BLj and /BLj to be precharged and equalized to the prescribed reference potential VBL at the time of standby.

An output gate (O gate) 50 includes n channel MOS transistors Q16 and Q17 for inverting and amplifying the signal potentials on bit lines BLj and /BLJ and transmitting the same to nodes N7 and N8, respectively, and n channel MOS transistors Q18 and Q19 which are turned on in response to a column select signal Yj from column decoder 5 (see FIG. 4), for transmitting the signal potentials on the nodes N7 and N8 to read out data transmission signal lines 15b and 15a, respectively. One conduction terminal of each of transistors Q16 and Q17 is connected to the potential Vss of "L" level and the gates thereof are connected to bit lines BLj and /BLj, respectively. Accordingly, when the potential of bit line BLj attains "H", the signal potential of "L" is transmitted to the node N7 through transistor Q16. At this time, as the complementary bit line /BLj is at "L" level, transistor Q17 is off and the node N8 is brought to a floating state. When the column select signal Yj rises to "H", the node N7 is connected to read out data transmission line 15b and the precharge potential of read out data transmission line 15b is discharged to the potential Vss level. Even if transistor Q19 is turned on, the potential of read out data transmission line 15a is held at the precharge potential (Vcc level).

Figure 7:
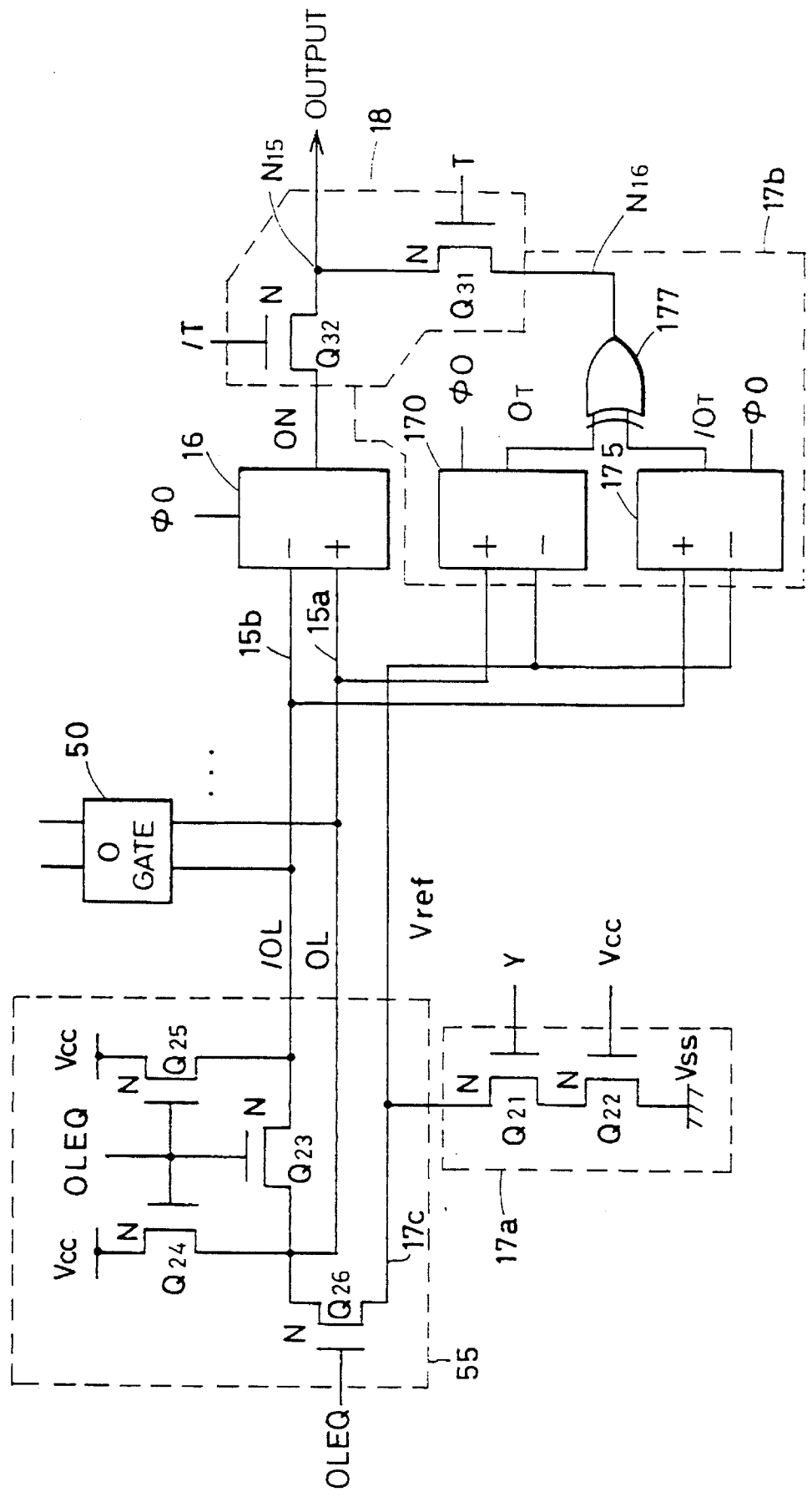
FIG. 7 is a diagram specifically showing the structures of a second precharge/equalize circuit, a test circuit, a read out circuit and a selection circuit shown in FIG. 5.

FIG. 7 is a diagram showing the structure of a circuit of a portion related to data output in more detail. In FIG. 7, a read out circuit 16 includes a differential amplifying circuit which is activated in response to a read out control signal φ0, for differentially amplifying read out data OL and /OL on read out data transmission lines 15a and 15b and deriving output data ON. The control signal φ0 is an internal control signal for supplying an output timing of the data.

A reference potential generating circuit 17a includes an n channel MOS transistor Q22 receiving the operation power supply potential Vcc at its gate and having one conduction terminal connected to the potential Vss, and an n channel MOS transistor Q21 receiving a reference potential generation instructing signal Y at its gate and having one conduction terminal connected to a reference potential transmission line 17c and the other conduction terminal connected to the other conduction terminal of MOS transistor Q22. The channel widths (or gate widths) of transistors Q21 and Q22 are set smaller than that of the transistor included in output gate 50. Accordingly, the current drive capability of reference potential generating circuit 17a is set smaller than that of output gate 50 and the discharging rate of reference potential transmission line 17c is set slower than that in a case where one memory cell is connected to read out data transmission lines 15a and 15b.

A second precharge/equalize circuit 55 includes an n channel MOS transistor Q23 which is turned on in response to an output portion precharge instructing signal OLEQ, for electrically short-circuiting read out data transmission line 15a and read out data transmission line 15b, n channel MOS transistors Q24 and Q25 which are turned on in response to the output portion precharge instructing signal OLEQ, for charging read out data transmission lines 15a and 15b to the operation power supply potential Vcc, respectively, and an n channel MOS transistor Q26 which is turned on in response to the output portion precharge instructing signal OLEQ, for electrically short-circuiting read out data transmission line 15a and reference potential transmission line 17c.

A determination circuit 17b includes a differential amplifier 170 for differentially amplifying the signal potential on read out data transmission line 15a and the signal potential on reference potential transmission line 17c, and a second differential amplifier 175 for differentially amplifying the signal potential on read out data transmission line 15b and the reference potential on reference potential transmission line 17c. Differential amplifiers 170 and 175 are activated in response to an internal control signal φ0 in the same way as read out circuit 16.

Determination circuit 17b further includes a non-coincidence detection circuit 177 for receiving an output OT from differential amplifier 170 and an output /OT from differential amplifier 175. Non-coincidence detection circuit 177 supplies a signal of "L" when the output signals OT and /OT from differential amplifiers 170 and 175 both indicate the same logical value and supplies a signal of "H" when the logical values of them are different from each other.

A selection circuit 18 includes a first selection gate Q31 which is turned on in response to a test mode instructing signal T, for transmitting the output of non-coincidence detection circuit 177 to the node N15, and a second selection gate Q32 which is turned on in response to the inverted signal /T of the test mode instructing signal, for transmitting the output ON from read out circuit 16 to the node N15. Selection gates Q31 and Q32 both include an n channel MOS transistor.

Read out circuit 16 and determination circuit 17b are provided on the side of one end of read out data transmission lines 15a and 15b and reference potential transmission line 17c, and output portion precharge/equalize circuit 55 and reference potential generating circuit 17a are provided on the other end of reference potential transmission line 17c and read out data transmission lines 15a and 15b. The distributions of capacitances of read out data transmission lines 15a and 15b and reference potential transmission line 17c for read out circuit 16 and for determination circuit 17b can be made the same and the electrical characteristics on signal lines 15a, 15b, and 17c can be made the same by locating output portion precharge/equalize circuit 55 and reference potential generating circuit 17a in the same place, so that the signal change characteristics on signal lines 15a, 15b and 17c can be set to desired values. Reference potential transmission lines 15a and 15b and reference potential transmission line 17c are arranged parallel to each other. The operation thereof will now be described.

A description will be made of a case where a word line WL1 is first selected at the time of the normal mode operation and data of logic "1" is written into memory cell 1a1.

An internal row address and an internal column address are generated from address buffer 2 with an internal address A0 to An. As it is the time of the normal mode operation, address switching circuit 4 supplies the supplied internal column address to column decoder 5 as it is. Row decoder 3 raises word line W11 to "H" of a selected state in response to the internal row address from address buffer 2. Column decoder 5 raises only the column select signal Y1 to "H" in response to the internal column address from address buffer 2. At the time of writing data, the internal write instructing signal W is set to "H" by an externally applied write instructing signal (not shown). As the internal write data Din is at logic "1", write circuit 9 transmits the data IL of logic "1" onto a write data transmission line 20a and transmits the data /IL of logic "0" onto a write data transmission line 20b.

In memory cell array 1, after the potential of selected word line WL1 attains "H", sense amplifier circuit 6 is operated, data of one row of memory cells 1a1 to 1d1 to be connected to word line WL1 are transmitted to corresponding bit lines and signal potentials on each bit line pair BL1, /BL1 to BL4, /BL4 are amplified and latched.

In this state, the column select signal Y1 from column decoder 5 is activated and the internal write data IL and /IL transmitted onto write data transmission lines 20a and 20b are transmitted to bit lines BL1 and /BL1. Data of logic "1" is transmitted to bit line BL1 and data of logic "0" is transmitted to the complementary bit line BL1. Data of logic "1" on bit line BL1 is written into memory cell capacitor CO through transfer gate transistor Q0 of memory cell 1a1. Thereafter, the potential of word line WL1 falls to "L", sense amplifier circuit 6 is brought to an inactive state and writing of data is completed.

In a case where data of logic "0" is written into memory cell 1a1, internal write data IL and /IL attain the potentials of logic "0" and logic "1", respectively. Data is not written into the non-selected memory cells 1b1 to 1d1 among memory cells 1a1 to 1d1 connected to selected word line WL1 and the stored data therein are simply refreshed.

A description will now be made of a case where data of logic "1" written into this memory cell 1a1 is read out with reference to FIG. 8, a waveform diagram of the operation thereof. While semiconductor memory device 200 is in a standby state, the bit line precharge instructing signal ϕEQ is at "H" level of the operation power supply voltage Vcc and the precharge instructing signal OLEQ of the output portion is also at "H" of the operation power supply potential Vcc level. In this case, as shown in FIG. 6, transistors Q7 to Q9 included in bit line precharge circuit 70 are all in an on state and each bit line pair BLj, /BLj (j=1 to 4) is precharged and equalized to a prescribed precharge potential VBL. In FIG. 8, a case is shown where the precharge potential VBL is ½ of the operation power supply potential Vcc.

Transistors Q23 to Q26 in precharge/equalize circuit 55 of the output portion are all in the on state, precharging read out data transmission lines 15a and 15b and reference potential transmission line 17c to "H" level of Vcc–Vth, wherein Vth is a threshold voltage of transistors Q24 and Q25. In the standby state, the first sense amplifier activation signal SN is at the precharge potential level of Vcc/2 and the second sense amplifier activation signal SP is also at the precharge potential level of Vcc/2. Similarly, the output ON of read out circuit 16 is at the precharge potential level of Vcc/2.

At time t0, when semiconductor memory device 200 enters the memory cycle, the bit line equalize instructing signal ϕEQ falls from "H" to "L". As a result, transistors Q7 to Q9 in bit line precharge circuit 70 are all turned off and bit line pair BLj, /BLj is brought to the floating state at the precharge potential Vcc/2.

Then, row decoder 3 performs a row selecting operation according to the internal row address from address buffer 2, raising the potential of word line WL1 to "H" at time t1. The potential level of "H" of the selected word line WL1 is set to be a higher level than Vcc+Vth wherein Vth is a threshold voltage of transfer gate transistor Q0 included in the memory cell. The potential of word line WL1 is increased to the operation power supply potential Vcc or more in this way in order to read out all the electric charge stored in memory capacitor CO to corresponding bit lines without any loss since a voltage, for example, 3.3 V is normally employed as the operation power supply voltage Vcc in a semiconductor memory device of a large storage capacity.

When the potential of word line WL1 rises to "H", data of a memory cell connected to the selected word line WL1 is transmitted to a corresponding bit line BLj (or /BLj). As memory cell 1a1 stores data of logic "1", the potential of bit line BL1 is increased to more than Vcc/2 and the amount of increase in potential of bit line BL1 reaches ΔV at time t2. The potential of the complementary bit line /BL remains the precharge potential of Vcc/2.

When the potential of word line WL1 rises to "H" and a minimum potential difference ΔV required is caused on each bit line pair BLj, /BLj, the first sense amplifier activation signal SN falls to "L" at time t3. As a result, the sense amplifier including transistors Q1 and Q2 shown in FIG. 6 is operated and the potential of bit line /BL1 of a lower potential falls from Vcc/2 to "L" level. Transistors Q1 and Q2 perform discharging operations at high speed and the potential of the complementary bit line /BL1 is discharged to "L" substantially at time t3. At this time, the potential of bit line BL1 of a higher potential keeps a potential level substantially the same as in a state where the memory cell data is transmitted.

At time t4, when the second sense amplifier activation signal SP rises to "H", the sense amplifier including transistors Q3 and Q4 shown in FIG. 6 is operated, increasing the potential Vcc/2+ΔV of bit line BL1 of the higher potential to "H" of the operation power supply potential level at high speed. As a result, the potential levels of bit lines BL1 and /BL1 are brought to the operation power supply potential Vcc and the ground potential level 0, respectively, and the sensing and amplifying operation by sense amplifier 60 is completed.

On the output side, the output precharge instructing signal OLEQ falls from "H" to "L" simultaneously with the sensing operation at time t5. As a result, read out data transmission signal lines 15a and 15b are brought to the floating state of Vcc–Vth level.

After this precharge instructing signal OLEQ falls to "L", at time t6, the column select signal Y1 from column decoder 5 rises to "H". As a result, transistors Q18 and Q19 included in output gate 50 shown in FIG. 6 are turned on. Transistors Q16 and Q17 receive the signal potentials on bit lines BL1 and /BL1 at the gates, respectively. Now the potential of bit line BL1 is at "H", and the signal potential on the complementary bit line /BL1 is at "L". Thus, transistor Q16 is turned on, and transistor Q17 is turned off. Accordingly, the precharge potential Vcc–Vth of read out data transmission signal line 15b is discharged to the order of 0 V of the ground potential level through transistors Q18 and Q16 in the on state while read out data transmission signal line 15a maintains the precharge potential Vcc–Vth.

The data read out instructing signal φ0 rises to "H" at time t7 immediately after the column select signal Y1 is raised. Correspondingly, read out circuit 16 is activated, differentially amplifying the signal potentials on read out data transmission signal lines 15a and 15b to generate output data ON.

At time t8, data of logic "1" is supplied from read out circuit 16. The output data ON is supplied through transistor Q32 in the on state. The operation stated above causes data of logic "1" to be read out.

In a case of reading data of logic "0", the potential levels of bit lines BL1 and /BL1 are opposite to those at the time of reading logic "1" stated above and the same operation is performed. In this case, read out circuit 16 is so structured as to supply data of logic "1" when the signal potential on read out data transmission signal line 15a is higher than the signal potential on read out data transmission signal line 15b.

The operation at the time of the test mode will now be described.

Now consider a case where the same data (logic "1" or "0") is simultaneously written into memory cells 1a1, 1b1, 1c1, and 1d1 of 4 bits connected to word line WL1 in FIG. 5 and the data of memory cells 1a1, 1b1, 1c1 and 1d1 of 4 bits are simultaneously read out. In this case, while the number of memory cells to be simultaneously selected is 4 bits, the number of memory cells to be simultaneously selected can be arbitrarily set, that is, it can be set to an arbitrary number such as 2, 8, or the number of all the memory cells connected to one row by address switching circuit 4. Additionally, the positional relationship between columns to be simultaneously selected in the memory cell array 1 may be suitably determined. Firstly, a description will now be made of a case where data of logic "1" is written.

At the time of the test mode operation, a test mode instructing signal T is set to the active state of "H". Address switching circuit 4, in response to the test mode instructing signal T in the active state, converts least significant two bits in the internal column address supplied from address buffer 2 into a value such that memory cells of 4 bits are simultaneously selected and then supplies the same to column decoder 5. Column decoder 5 decodes the converted internal column address from address switching circuit 4 and simultaneously raises column select signals Y1, Y2, Y3 and Y4 to "H" in order to select memory cells of 4 bits from memory cell array 1.

That is, at the time of the test mode operation, memory cell array 1 is divided into blocks on a 4-bit basis, for example, and column decoder 5 functions as a block decoder for selecting a block. At the time of writing data, in the same way as at the time of the normal mode operation, the internal write data IL attains logic "1", the internal write data /IL attains logic "0", the internal write instructing signal W is brought to the active state of "H", and the column select signals Y1, Y2, Y3 and Y4 simultaneously attain "H". Additionally, in this state, word line WL1 has already risen to "H" of the selected state. As a result, input gates 80a, 80b, 80c and 80d are simultaneously turned on, transmitting the internal write data IL and /IL to bit lines BL1, /BL1 to BL4, /BL4, respectively. Data of logic "1" is thereby written into memory cells 1a1, 1b1, 1c1 and 1d1 of 4 bits.

A description will now be made of the operation in which data of logic "1" are simultaneously read out from memory cells 1a1 to 1d1 of 4 bits to determine good/defective of memory cells 1a1 to 1d1 with reference to FIG. 9, a waveform diagram of the operation thereof. In FIG. 9, operation waveforms of the same portions as those in FIG. 8 are omitted. In the same way as in the case shown in FIG. 8, when the sensing operation by sense amplifier circuit 6 (see FIG. 4) is completed, at time t5 (see FIG. 8), the signal potentials on bit lines BL1, BL2, BL3 and BL4 are at "H" of Vcc level and the potentials of the complementary bit lines /BL1, /BL2, /BL3 and /BL4 are at "L" of the ground potential level. In this state, transistor Q16 for receiving the signal potentials on bit lines BL1, BL2, BL3 and BL4 at its gate is turned on and transistor Q17 is turned off in output gates 50a, 50b, 50c and 50d. Accordingly, the potential of the node N7 is at "L" and the node N8 is in the floating state.

In this state, at time t6 (see FIG. 8), when the column select signals Y1, Y2, Y3 and Y4 from column decoder 5 simultaneously rise to "H", transistors Q18 and Q19 included in output gates 50a, 50b, 50c and 50d are turned on, and the potential of read out data transmission signal line 15b falls to "L". Now, the four output gates 50a, 50b, 50c and 50d are simultaneously turned on, so that the rate of the potential drop of output data transmission signal line 15b becomes higher than the rate of discharging by one output gate at the time of the normal mode.

The reference potential generation instructing signal Y rises to "H" substantially at the same timing as that of the rising of the column select signals Y1 to Y4 to "H". It may be so structured that the reference potential generation instructing signal Y is generated from a dummy decoder contained in column decoder 5, which is activated only at the time of the test mode or it is generated using an inverted delay signal of the output precharge instructing signal OLEQ. Transistor Q21 is turned on in response to the reference potential generation instructing signal Y. The operation power supply potential-Vcc has been applied to the gate of transistor Q22, which is in the on state all the time. The precharge potential of reference potential transmission signal line 17c is thereby discharged to "L" level.

In this case, as stated above, the transistor widths (channel widths or gate widths) of transistors Q21 and Q22 are set smaller than those of transistors Q16 and Q18 (or Q17 and Q19) included in the output gate, for example, ½, and the falling rate of the reference potential Vref in reference potential transmission signal line 17c is by far low compared with that of reference potential read out data transmission signal line 17b.

At time t7, the internal read out instructing signal φ0 rises to "H". At time t7, there has already been a difference between the potentials on read data transmission signal lines 15a and 15b and the reference potential Vref on reference potential transmission signal line 17c, and differential amplifier circuits 170 and 175 differentially amplify the potential difference of corresponding signal line pairs at high speed. Differential amplifier 170 supplies a signal of "1" when the reference potential Vref on reference potential transmission signal line 17c is lower than the signal potential OL on read out data transmission signal line 15a, and differential amplifier circuit 175 derives an output of "1" when the reference potential Vref is smaller than the read out data/OL.

Accordingly, the output signal OT from differential amplifier circuit 170 is increased to logic "1" of the power supply potential Vcc level from the precharge potential level Vcc/2 while the output signal /OT from differential amplifier circuit 175 falls from the precharge level Vcc/2 to the ground potential level "L" (logic 0).

A non-coincidence detection circuit 177 supplies a signal of logic "1" when the logic of the output signal OT does not coincide with the logic of the output signal /OT. Accordingly, in this case, the output of non-coincidence detection circuit 177 is logic "1" and, at time t8, the output is transmitted to the node N15 through transistor Q31 in the on state. When the logical value of the output signal from determination circuit 17b is "1", it means the logics of the stored data of the four memory cells 1a1 to 1d1 to be simultaneously selected all coincide with each other and semiconductor memory device 200 is operating normally.

When the four memory cells 1a1 to 1d1 store data of logic "0", the read out data OL and /OL transmitted on read out data transmission signal lines 15a and 15b attain logics "0" and "1". In this case, the output OT from differential amplifier circuit 170 attains logic "0" while the output signal /OT from differential amplifier circuit 175 attains logic "1". In this case as well, the output of non-coincidence detection circuit 177 attains logic "1", indicating that all the logics of the stored data of the simultaneously selected memory cells 1a1 to 1d1 of 4 bits are the same and it means that semiconductor memory device 200 is operating normally. A case will now be described where the semiconductor memory device malfunctions, with reference to FIG. 10, a waveform diagram of the operation thereof.

If the semiconductor memory cell is malfunctioning (that is, a defective bit is included), the read out data from the simultaneously selected memory cells 1a1 to 1d1 of 4 bits contain logic "1" and logic "0" in a mixed manner. Consider a case where only memory cell 1a1 malfunctions and supplies logic "0" when logic "1" is written into memory cells 1a1, 1b1, 1c1, and 1d1 of 4 bits and data is read out from the memory cells 1a1 to 1d1 of 4 bits. In this case, the signal potential of bit line BL1 attains logic "0" and the signal potential on the complementary bit line /BL1 attains logic "1" by the read out data of logic "0" from memory cell 1a1. As a result, transistor Q17 included in output gate 50 is turned on. When the column select signals Y1–Y4 are generated, the precharge potential Vcc–Vth of read out data transmission signal line 15a is discharged and the potential thereof drops.

The signal potentials on bit lines BL2, BL3 and BL4 attain logic "1" in the remaining memory cells 1b1, 1c1 and 1d1, read out data transmission signal line 15b is discharged and the read out data/OL thereon changes to logic "0".

The reference potential Vref on reference potential transmission signal line 17c drops at a predetermined rate regardless of the read out data of the simultaneously selected memory cells 1a1 to 1d1. FIG. 10 shows the relationship between the read out data OL, /OL and the reference potential Vref and the output from determination circuit 17b in this state with magnification. As stated above, the transistor widths (channel widths or gate widths) of transistors Q21 and Q22 included in reference potential generating circuit 17a are set smaller than those of transistors Q16 to Q19 included in this output gate. Accordingly, the potential drop rate of the reference potential Vref on reference potential transmission signal line 17c is lower than the potential drop rates of read out data transmission signal liens 15a and 15b.

Accordingly, when the internal read out instructing signal φ0 rises to "H" at time t7 and the amplifying operations of differential amplifier circuits 170 and 175 are performed, the potentials of the signals OL and /OL on read out data transmission signal lines 15a and 15b are smaller than the reference potential Vref. In this case, the outputs OT and /OT from differential amplifier circuits 170 and 175 both attain "0", i.e., the same logical values. The output (the potential of the node N16) of non-coincidence detection circuit 177 attains logic "0".

At time t8, when the potential of the node N16 is settled, the signal potential of the node N16 is transmitted to the node N15 through transistor Q31, so that data of "0" is supplied as an output. At the time of the test mode, when data of logic "0" is supplied externally, it can be determined that a defect is caused in any of memory cells 1a1 to 1d1 of 4 bits.

While the case has been described where only memory cell 1a1 inverts the stored data thereof and supplies data of logic "0" in the description above, even if there are two or three defective memory cells, the gradients of the voltage drop of the outputs OL and /OL shown in FIG. 10 are only changed (the gradient thereof is larger than that of Vref in either case), and a signal of logic "0" indicating the presence of a defective bit is supplied in the same way.

As stated above, according to the present invention, when the logics of the read out data from the simultaneously selected plurality of memory cells all coincide with each other (all at logic "0" or "1"), the output Dout attains logic "1" while when the read out data from the simultaneously selected memory cells include "0" and "1" in a mixed manner, it is possible to cause the output Dout to attain logic "0", so that it can be determined whether there is a defective bit in the memory cell array by identifying the logical value of the output Dout.

Though it may be structured so that the test mode instructing signal T is externally applied through an input terminal, or it may be generated by setting a specified combination of timing conditions of external clock signals as in WCBR scheme in the embodiment above, this may be also structured so that it is generated by applying a voltage out of the normally used range to an arbitrary input/output terminal (for example, an address pin or the like which becomes unnecessary at the time of the test mode operation), or it is generated inside the memory device, combining the voltage condition and the timing condition of the control signals.

Though a dynamic random access memory was described as a semiconductor memory device in the embodiment above, the same effect as in the above-mentioned embodiment can be achieved with a semiconductor memory device such as a static type memory (SRAM) in which complementary signals are read out from a memory cell. In the case of the SRAM, it is not particularly required to provide sense amplifier circuit 6 for bit lines or precharge circuit 7 for bit lines.

The same effect can also be achieved by setting the logical value of the output to "0" when the logical values of data read out from the simultaneously selected plurality of memory cells coincide with each other at the time of the test mode, and setting the output logical value to logic "1" when the logical values of the read out data include "0" and "1" in a mixed manner in the embodiment above.

Though determination circuit 17b is activated in response to the internal read out instructing signal φ0, it may be structured so that a signal of a logical product of the test mode instructing signal T and the internal read instructing signal φ0 is supplied to the determination circuit as an activation signal.

Figure 11:
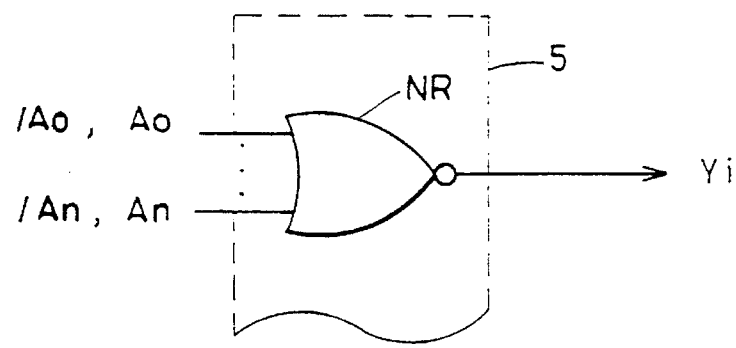

A description will now be made of a structure for selecting a memory cell of 1 bit at the time of the normal mode operation and for simultaneously selecting memory cells of a plurality of bits at the time of the test mode. Consider now a case where column decoder 5 is a NOR type decoder as shown in FIG. 11. A unit column decoder is shown in FIG. 11. An arbitrary combination of internal column address bits in the internal column address bits A0, /A0 to An, /An from address buffer 2 is supplied to unit column decoder NR. Column decoder NR raises the column select signal Yi to "H" when the supplied internal column address bits are all at "L" or logic "0".

Figure 12:
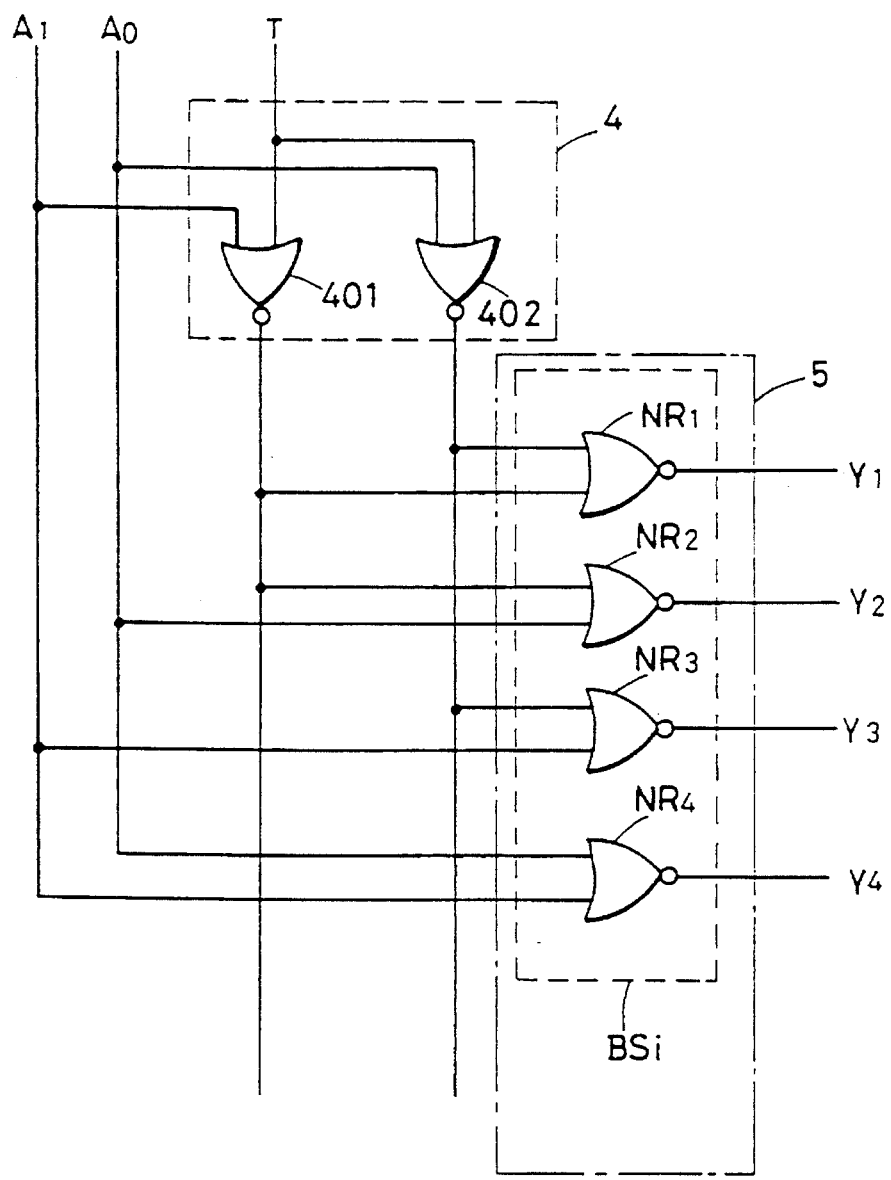
FIG. 12 is a diagram showing one example of a specific structure of an address switching circuit and a column decoder shown in FIG. 4.

FIG. 12 is a diagram specifically showing the structure of address switching circuit 4 and column decoder 5 shown in FIG. 4 employing this NOR type decoder structure. Column decoder 5 is divided into a plurality of blocks. In FIG. 12, only block BSi is representatively shown. Decoder block BSi includes four NOR circuits NR1, NR2, NR3 and NR4. Column select signals Y1 to Y4 are generated from NOR circuits NR1 to NR4. Though the same combination of the most significant column address bits A2 to An are supplied to NOR circuits NR1 to NR4 included in this block BSi in the same way, most significant column address bits are omitted in order to simplify the figure. Most significant column address bits A2 to An are employed as a block select signal.

Address switching circuit 4 includes two NOR circuits 401 and 402. NOR circuit 401 receives a column address bit A1 at one input and a test mode instructing signal T at the other input. The second NOR circuit 402 receives a column address bit A0 at its one input and a test mode instructing signal T at the other input.

Referring back to the structure of column decoder 5, NOR circuit NR1 receives the outputs of NOR circuit 401 and NOR circuit 402. NOR circuit NR2 receives the column address bit A0 and the output of NOR circuit 401. NOR circuit NR3 receives the column address bit A1 and the output of NOR circuit 402. NOR circuit NR4 receives the column address bits A0 and A1. The operation thereof will now be briefly described.

At the time of the normal operation mode, the test mode instructing signal T is set to "L". NOR circuits 401 and 402 thereby function as inverters. Now consider a case where the column address bits A0 and A1 are both at "L" when the decoder block BSi is selected. The outputs of NOR circuits 401 and 402 attain "H". Accordingly, the column select signals Y1 to Y3 from NOR circuits NR1 to NR3 for receiving the output (s) of NOR circuit 401 and/or NOR circuit 402 attain "L". As the both inputs of NOR circuit NR4 attain "L", the column select signal Y4 rises to "H".

Where the column address bit A0 attains "L" and the column address bit A1 attains "H", the output of NOR circuit 401 attains "L" and the output of NOR circuit 402 attains "H". At this time, the column select signal Y2 from NOR circuit NR2 for receiving the column address bit A0 and the output of NOR circuit 401 only attains "H" and the remaining column select signals Y1, Y3 and Y4 attain "L".

Where the column address bit A0 is at "H" and the column address bit A1 is at "L", the output of NOR circuit 401 attains "H" and the output of NOR circuit 402 attains "L". The column select signal Y3 from NOR circuit NR3 for receiving the column address bit A1 and the output of NOR circuit 402 rises to "H" and the remaining column select signals Y1, Y2 and Y4 attain "L".

Where the column address bits A0 and A1 are both at "H", the outputs of NOR circuits 401 and 402 both attain "L". The column select signal Y1 from NOR circuit NR1 for receiving the both outputs of NOR circuits 401 and 402 only rises to "H" and the remaining column select signals Y2 to Y4 all attain "L".

According to the structure stated above, address switching circuit 4 inverts and supplies the column address bits A0 and A1, so that a column is selected which is designated by the column address bits A0 and A1 of the least significant 2 bits in the block BSi selected by the column address bits A2 to An, realizing selection of 1 bit memory cell.

At the time of the test mode operation, the test mode instructing signal T attains "H". The outputs of NOR circuits 401 and 402 both attain "L". At this time, if the column address A0 and A1 of the least significant 2 bits are both at "L", the four NOR circuits NR1 to NR4 included in the decoder block BSi all receive a signal of "L" at their both inputs. As a result, the column select signals Y1 to Y4 all rise to "H", so that it becomes possible to simultaneously select memory cells of 4 bits.

That is, at the time of the test mode operation, a test can be conducted on a 4-bit basis by setting the column address bits A0 and A1 of the least significant 2 bits to "L" and sequentially changing the remaining most significant column address bits A2 to An.

Figure 13:
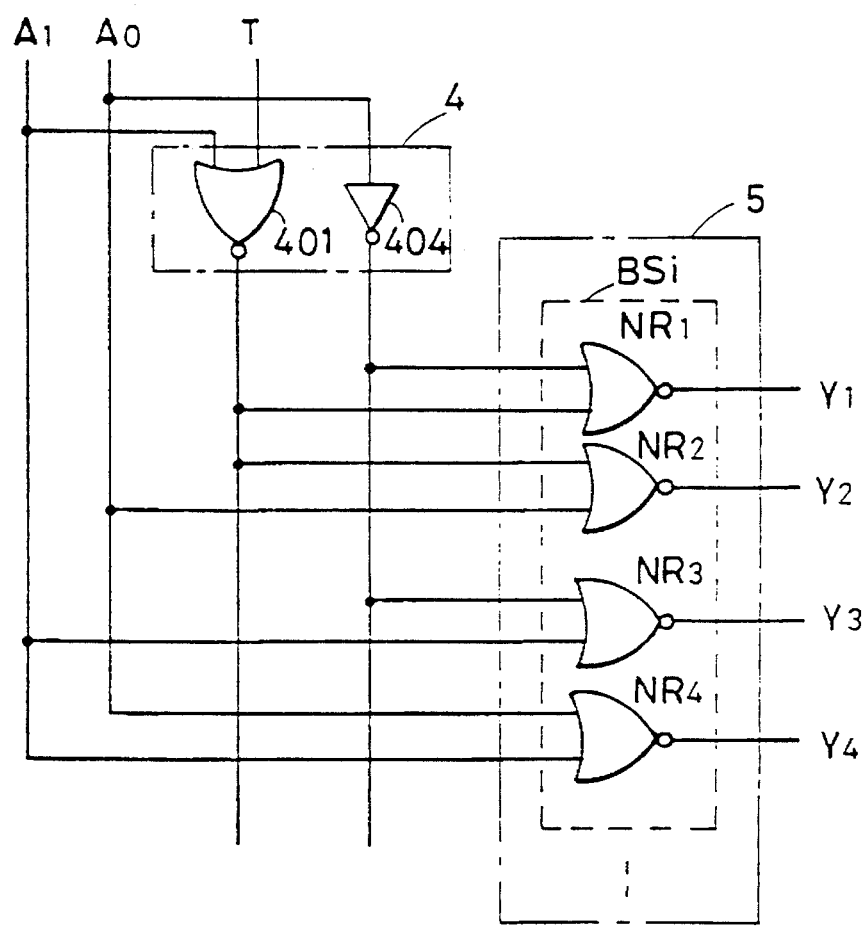
FIG. 13 is a diagram showing another example of the structure of the address switching circuit and the column decoder shown in FIG. 4.

FIG. 13 is a diagram showing another structure of address switching circuit 4. In FIG. 13, address switching circuit 4 includes a NOR circuit 401 for receiving the column address bit A1 and the test mode instructing signal T and an inverter circuit 404 for receiving the column address bit A0. A column decoder 5 has the same structure as that shown in FIG. 12. The operation thereof will be briefly described.

At the time of the normal mode operation, the test mode instructing signal T is at "L" and NOR circuit 401 operates as an inverter circuit. Accordingly, in this case, in the same way as in the structure shown in FIG. 12, any of NOR circuits NR1 to NR4 is selected by a combination of the column address A1 and A0 of 2 bits.

At the time of the test mode operation, the test mode instructing signal T attains "H" and the output of NOR circuit 401 attains "L". When the column address bits A1 and A0 are both at "L", NOR circuits NR2 and NR4 are selected. That is, the column select signals Y2 and Y4 rise to "H". The remaining two column select signals Y1 and Y3 both attain "L". When the column address bit A0 is at "H" and the column address bit A1 is at "L", NOR circuits NR1 and NR3 are selected and the column select signals Y1 and Y3 attain "H".

Therefore, in this case, supposing that column address bits A1 to An are block select signals, column decoder 5 is divided into a plurality of blocks each including two NOR circuits and column selection in the blocks is performed with the least significant column address bit A0. Accordingly, in this case, a test for memory cells can be conducted on a two-bit basis.

FIGS. 12 and 13 show structures simply by way of example and the structures can be easily expanded to a structure of an address switching circuit and a column decoder circuit for simultaneously selecting a plurality of different memory cells. The same effects can be achieved as in the embodiment above by using a NAND type unit decoder circuit instead of a NOR type decoder circuit for the structure of the column decoder.

Figure 14:
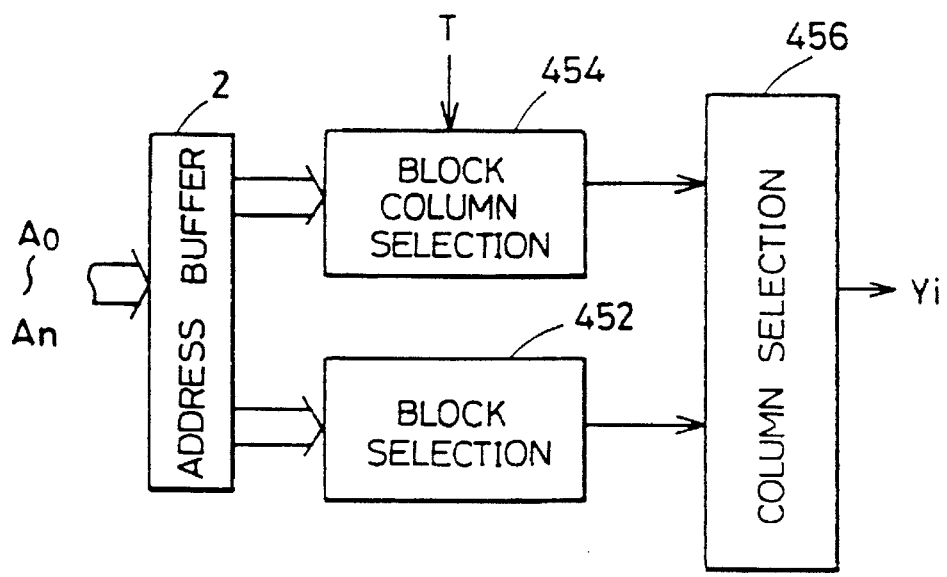
FIG. 14 is a diagram showing another example of the structure of column select signal generating circuitry in a semiconductor memory device according to the present invention.

FIG. 14 is a diagram schematically showing another example of the structure of address switching circuit 4 and column decoder 5. In FIG. 14, the column select signal generating circuitry includes a block selection circuit 452 for decoding a block select signal (for example, a prescribed most significant internal column address bit(s) in the internal column address) from address buffer 2 and generating a signal for selecting a corresponding block within the memory cell array, a block column selection circuit 454 for receiving a block column address (the remaining (least significant) column address bits) from address buffer 2 and generating a signal for selecting a column within this block, and a column selection circuit 456 responsive to a block select signal from block selection circuit 452 and a block column select signal from block column selection circuit 454 for generating a column select signal Yi for selecting a column within the memory cell array.

Block column selection circuit 454 generates a signal for causing all the columns within a selected block when the test mode instructing signal T is at "H" of the active state. At the time of the normal mode operation, block column selection circuit 454 decodes the internal column address bit from address buffer 2 and generates a signal for designating a block column. Block selection circuit 542 decodes a block designation address from address buffer 2 and generates a signal for selecting a corresponding block at the time of both the normal mode operation and the test mode operation. Column selection circuit 456 takes, for example, a logical product of the block select signal from block selection circuit 452 and the block column select signal from block column selection circuit 454 and generates a column select signal Yi for causing a corresponding column to be selected.

Also with the structure as shown in FIG. 14, it is possible to simultaneously select a plurality of memory cells included in one block and to conduct a test for the memory cells on a basis of a plurality of bits. A column address predecode architecture employed in a DRAM of a large storage capacity, for example, can be employed in a hierarchical structure of a column selection circuit including block selection circuit 452, block column selection circuit 454 and column selection circuit 456.

Figure 15:
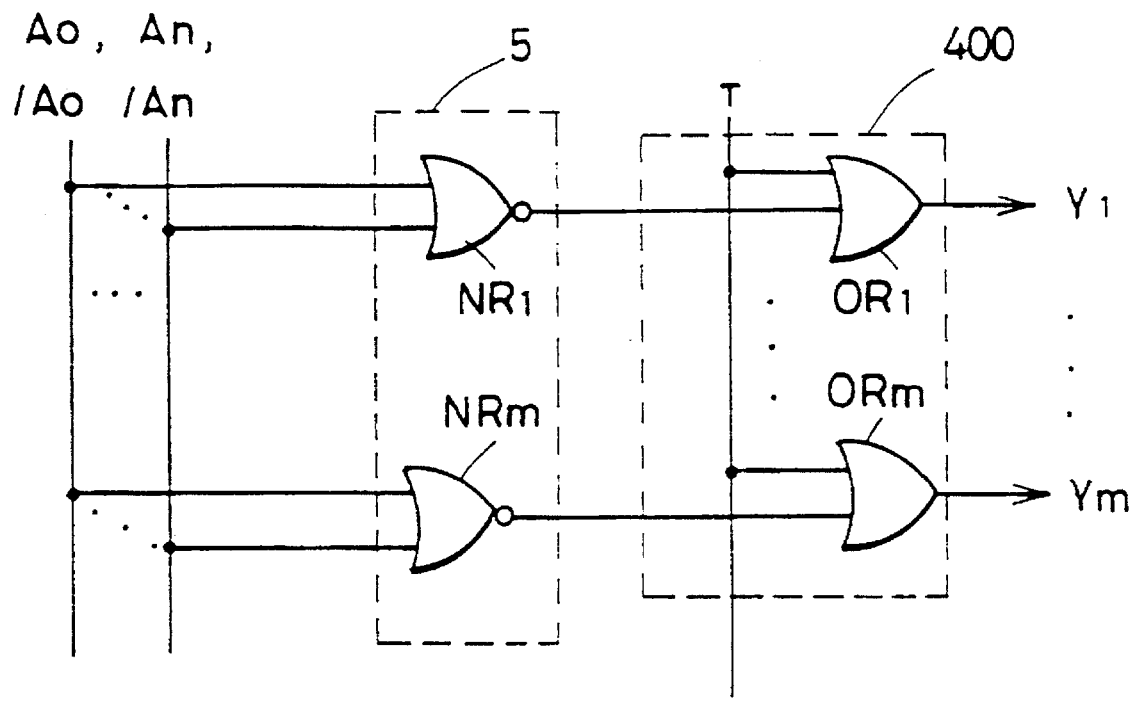
FIG. 15 is a diagram showing another example of the structure of column select signal generating circuitry in accordance with a semiconductor memory device according to the present invention.

FIG. 15 is a diagram showing the structure of a column address select signal generating circuitry in accordance with another embodiment of the present invention. In FIG. 15, an address switching circuit 400 is provided at the output of a column decoder 5. Address switching circuit 400 supplies column select signals Y0 to Ym. Column decoder 5 includes m NOR circuits NR1 to NRm each for receiving a predetermined combination of internal column address bits A0, /A0, An, /An. The structure of column decoder 5 is the same as that shown in FIGS. 11 to 13.

Address switching circuit 400 includes OR circuits OR1 to ORm provided corresponding to NOR circuits NR1 to NRm of column decoder 5. Each of OR circuits OR1 to ORm receives the output of a corresponding NOR circuit NR1 to NRm and a test mode instructing signal T. OR circuits OR1 to ORm supply column select signals Y1 to Ym. In the structure shown in FIG. 15, at the time of the test mode operation, the column select signals Y1 to Ym from address switching circuit 400 all attain "H". At the time of the normal mode operation, one column select signal Yi (i=1 to m) selected by column decoder 5 only rises to "H". In accordance with the structure, all the memory cells connected in one row can be tested at the same time.

Figure 16:
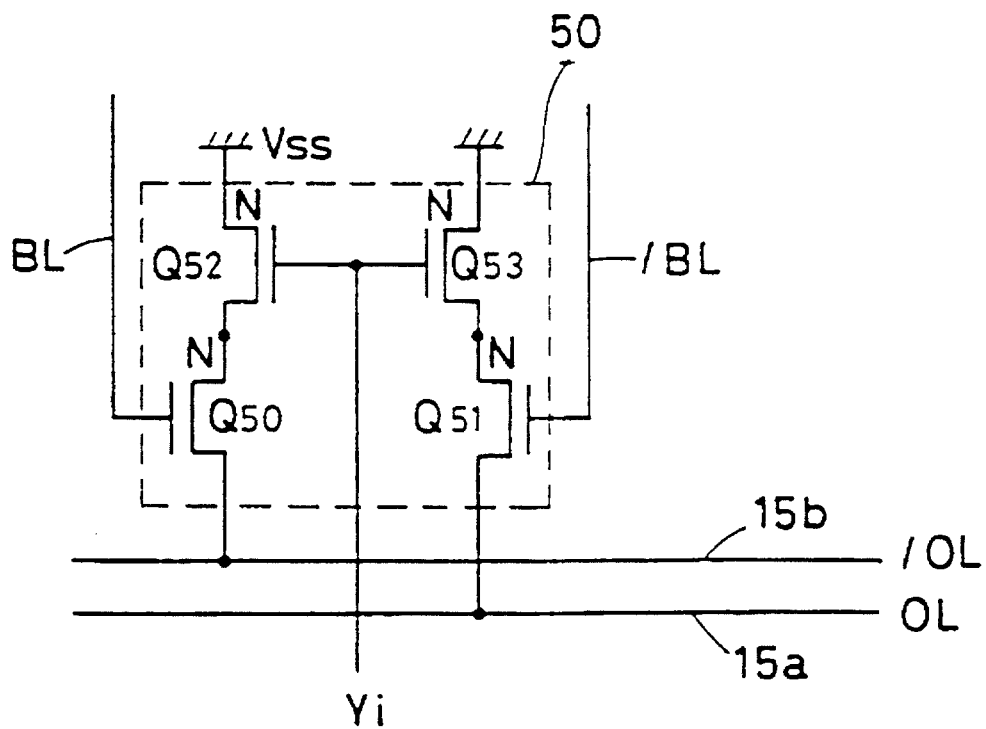
FIG. 16 is a diagram showing another example of the structure of the output gate circuit shown in FIG. 5.

FIG. 16 is a diagram showing another structure of output gate circuit 50. In FIG. 16, output gate circuit 50 includes 4 n channel MOS transistors Q50, Q51, Q52 and Q53. Transistor Q50 has the gate connected to bit line BL and one conduction terminal connected to read out data transmission signal line 15a. Transistor Q51 has the gate connected to the complementary bit line /BL and one conduction terminal connected to read out data transmission signal line 15b.

Transistor Q52 receives a column select signal Yi at its gate, is turned on, and connects the other conduction terminal of transistor Q50 to the potential Vss, a ground potential, for example. Similarly, transistor Q53 is turned on in response to the column select signal Yi and connects the other conduction terminal of transistor Q51 to the potential Vss. The signal potentials on the bit line pair BL and /BL can be amplified and transmitted to read out data transmission signal lines 15a and 15b using output gate circuit 50 as shown in FIG. 16 in the same way as in output gate circuit 50 shown in FIG. 6. The operation is the same as that of output gate circuit 50 shown in FIG. 6.

Figure 17:
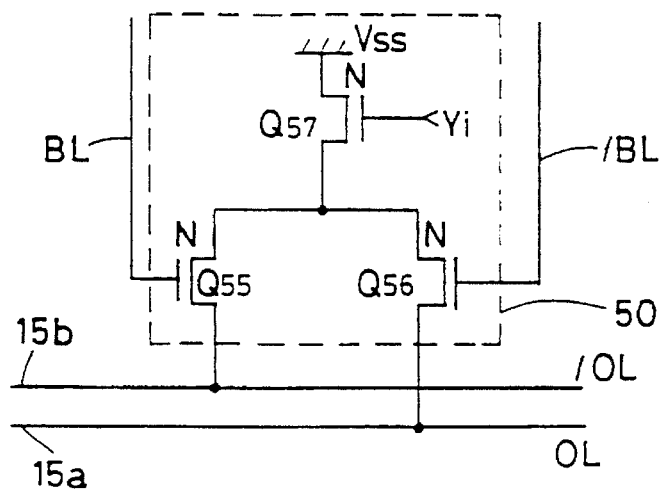
FIG. 17 is a diagram showing still another example of the structure of the output gate circuit shown in FIG. 5.

FIG. 17 is a diagram showing still another structure of the output gate circuit. In FIG. 17, output gate circuit 50 includes three n channel MOS transistors Q55, Q56 and Q57. Transistor Q55 has the gate connected to bit line BL and one conduction terminal connected to read out data transmission signal line 15b. Transistor Q56 has the gate connected to the complementary bit line /BL and one conduction terminal connected to read out data transmission signal line 15a. Transistor Q57 is turned on in response to a column select signal Yi and connects the other conduction terminal of each of transistors Q55 and Q56 to the ground potential Vss. In this structure, the same effects can also be achieved as in the structures of the output gate circuits shown in FIGS. 6 and 16.

Figure 18:
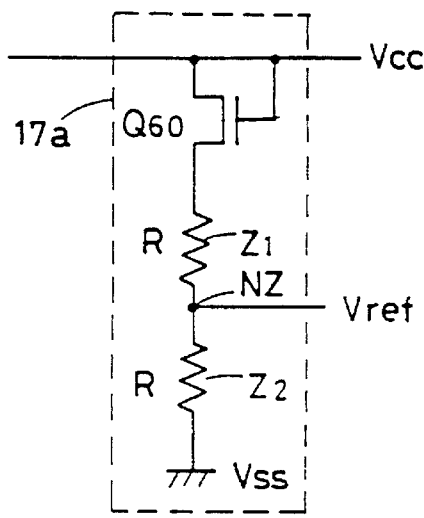
FIG. 18 is a diagram showing another example of the structure of a reference potential generating circuit shown in FIGS. 4 and 5.

FIG. 18 is a diagram showing one example of another structure of reference potential generating circuit 17a shown in FIGS. 5 and 7. In FIG. 18, reference potential generating circuit 17a includes an n channel MOS transistor Q60 for receiving the operation power supply potential Vcc at its gate and one conduction terminal and resistance elements Z1 and Z2 connected in series between the other conduction terminal of transistor Q60 and the ground potential Vss. The reference potential Vref is generated from the connection node NZ of resistance element Z1 and resistance element Z2.

Figure 19:
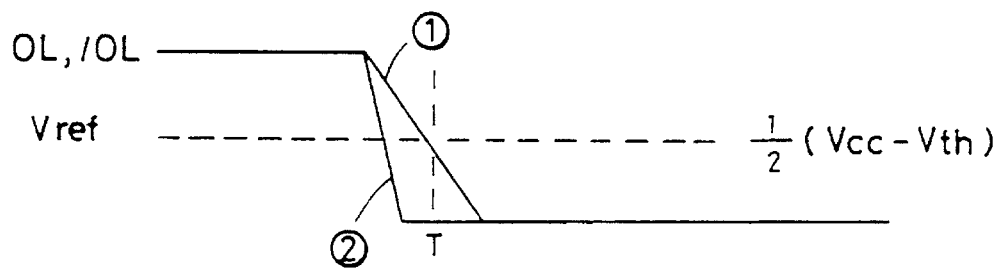
FIG. 19 is a diagram showing the relationship between a signal potential on a read out data transmission signal line and a reference potential when the reference potential generating circuit shown in FIG. 18 is employed.

In the structure shown in FIG. 18, as transistor Q60 has the gate and one conduction terminal connected to the operation power supply potential Vcc, the potential of Vcc–Vth is transmitted to the other conduction terminal of transistor Q60, wherein Vth is the threshold voltage of transistor Q60. Resistance elements Z1 and Z2 have the same resistance value R. Accordingly, the reference potential Vref is a fixed potential of (Vcc–Vth)/2. FIG. 19 shows the relationship between read out data OL, /OL and the reference potential Vref when reference potential generating circuit 17a shown in FIG. 18 is employed.

In FIG. 19, the potentials of internal readout data OL, /OL drop along the straight line ① for the straight line ② according to the logical values of the transmitted signals. Here, the straight line ① indicates the rate of the potential drop on read out data transmission signal line 15a or 15b in the slowest rate case and the straight line ② indicates the potential drop in the fastest rate case. Therefore, it is possible to surely amplify the internal read out data and to determine the presence or absence of a defective bit in the simultaneously selected plurality of memory cells by driving read out circuit 16 or determination circuit 17b at a certain point at or after time t, that is, the crossing point of the straight line ① and the reference potential Vref.

Figure 20:
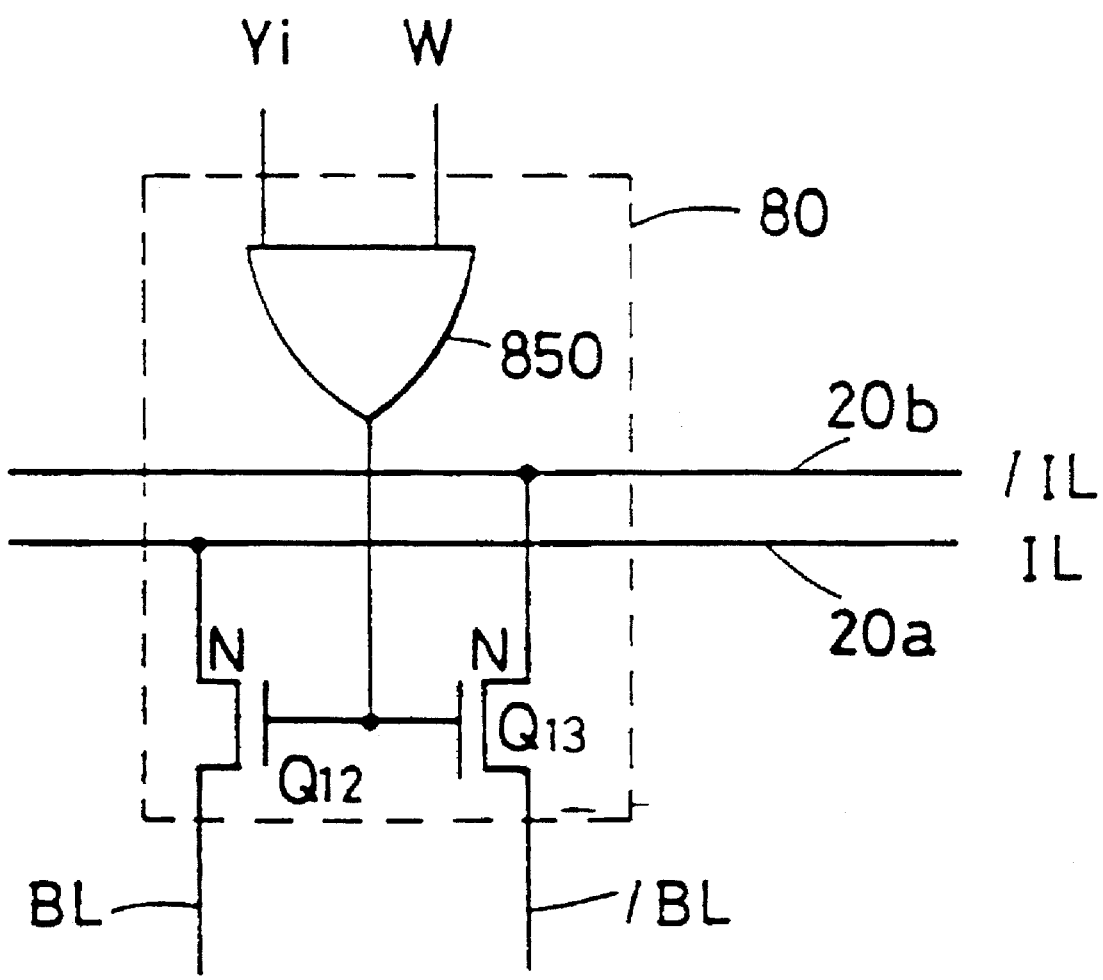
FIG. 20 is a diagram showing another example of the structure of the input gate circuit shown in FIG. 5.

FIG. 20 is a diagram showing another example of a structure of input gate circuit 80 shown in FIGS. 5 and 6. In FIG. 20, input gate circuit 80 includes an AND circuit 850 for receiving a column select signal Yi and an internal write instructing signal W, and n channel MOS transistors Q12 and Q13 which are turned on in response to the output of AND circuit 850, for connecting write data transmission signal lines 20a and 20b to bit lines BL and /BL, respectively. AND circuit 850 supplies a signal of "H" only when the both inputs thereof are at "H". Accordingly, as the internal write instructing signal W attains "L" at the time of reading data, AND circuit 850 can be brought to a disable state and it is possible to prevent writing of erroneous data.

At the time of writing data, the data output circuitry (read out circuit 16 and test circuit 17, and selection circuit 18) may be operated or may not be operated. In order to prevent output of the output data to the outside of the device at the time of writing data, a buffer circuit responsive to the data writing for setting the node NQ to a high impedance state may be provided between the node NQ and the output of selection circuit 18 shown in FIG. 4. In this case, there may also be employed a structure for disabling test circuit 17 and read out circuit 16 in response to the internal write instructing signal.

In the description above, a plurality of columns are selected from a block related to 1 bit data at time of the test mode.

Figure 1:
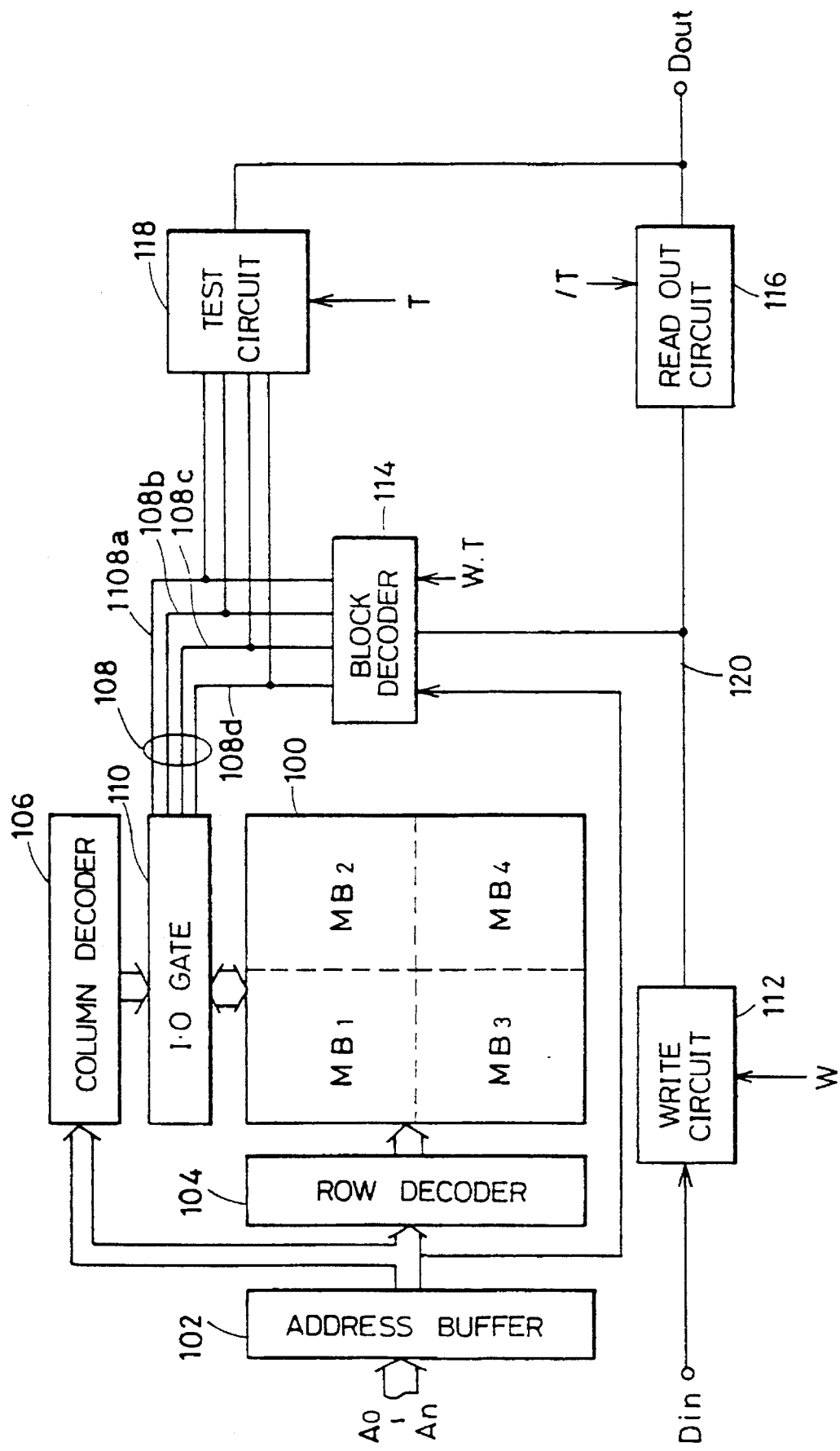
FIG. 1 is a diagram schematically showing the overall structure of a conventional semiconductor memory device.
Figure 2:
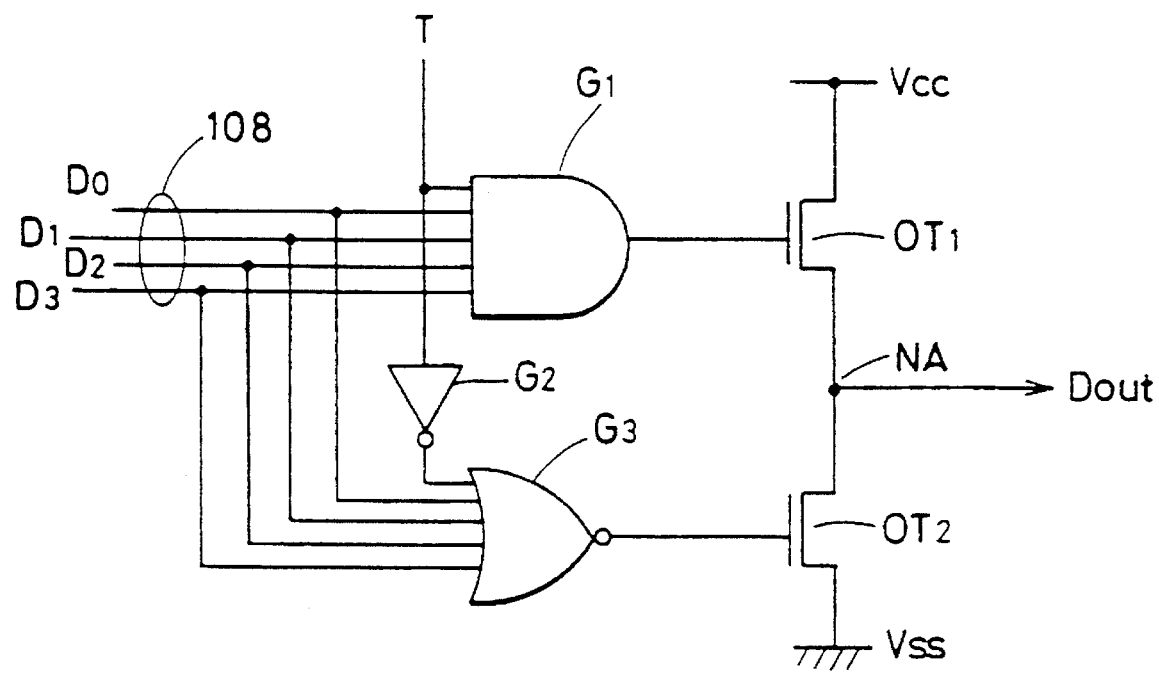
FIG. 2 is a diagram showing an example of a structure of a test circuit employed in the conventional semiconductor memory device.
Figure 3:
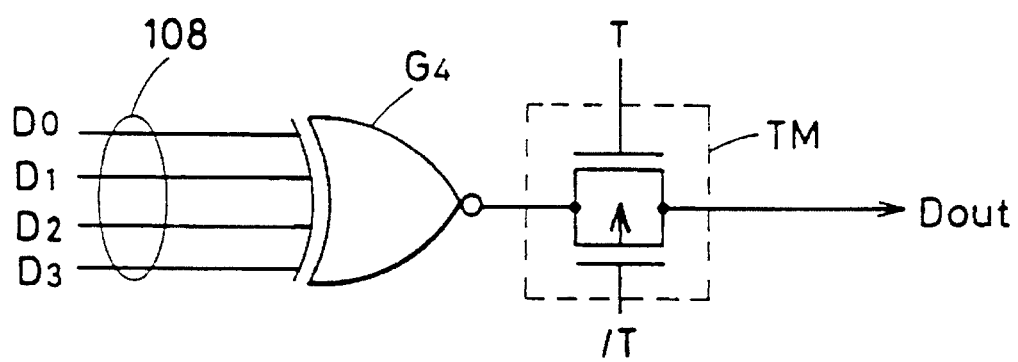
FIG. 3 is a diagram showing another example of the structure of the test circuit employed in the conventional semiconductor memory device.

Generally, a block dividing structure is employed in a large storage memory. In a memory of ×1 bit arrangement, one column from each block, that is, a total of four columns are selected and then one column among the four columns is selected (see the memory in FIG. 1).

Figure 21:
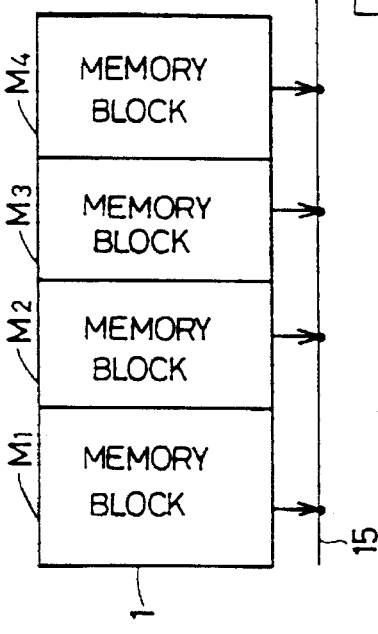
FIG. 21 shows an outline structure in another embodiment of the present invention.

In this case, there may be employed a structure in which the selected column of each block (the total of four columns) are simultaneously connected to read out signal line 15 as shown in FIG. 21. In accordance with the structure, column select signals Y1, Y2, Y3 and Y4 in the structure of the decoder shown in FIG. 12 correspond to memory blocks M1, M2, M3 and M4 in FIG. 21. Determination circuit 17b determines good/defective of the memory according to the relationship between the reference potential Vref and the signal potential on signal line 15.

Usually, an internal data line is provided for each of memory blocks M1 to M4. There may be employed a structure in which four internal data lines are connected to one internal data line and the signal potential on the one connected internal data line is determined by determination circuit 17b at the time of the test mode. At this time, a load impedance substantially the same as the load impedance (load capacitance) of the determination circuit is provided to the remaining three internal data lines, making the same the electric characteristics of the internal data transmission lines with each other.

Additionally, there may be employed a structure in which a signal line 15 dedicated to test is provided separately and all the internal data transmission line are connected to signal line 15 at the time of the test mode.

In FIG. 21, when only one column is selected from the four memory blocks and connected to the data read out line, as one internal data line is provided commonly for each memory block, the internal data line is used as signal line 15. In this case, the block select signal (normally, most significant bits of the row address and the column address are used) selects all the blocks at the time of the test mode. This structure can be derived from the structure shown in FIG. 12.

Furthermore, in a case where internal data lines are provided for each block and one column is selected from each block and connected to a corresponding internal data line in a memory of the block dividing structure, there may be employed a structure in which a plurality of columns are connected to corresponding signal lines 150a to 150d from each memory block MB1 to MB4 at the time of the test mode. One memory block MB (MB1 to MB4) in the structure shown in FIG. 22 corresponds to the structure shown in FIG. 5.

Figure 22:
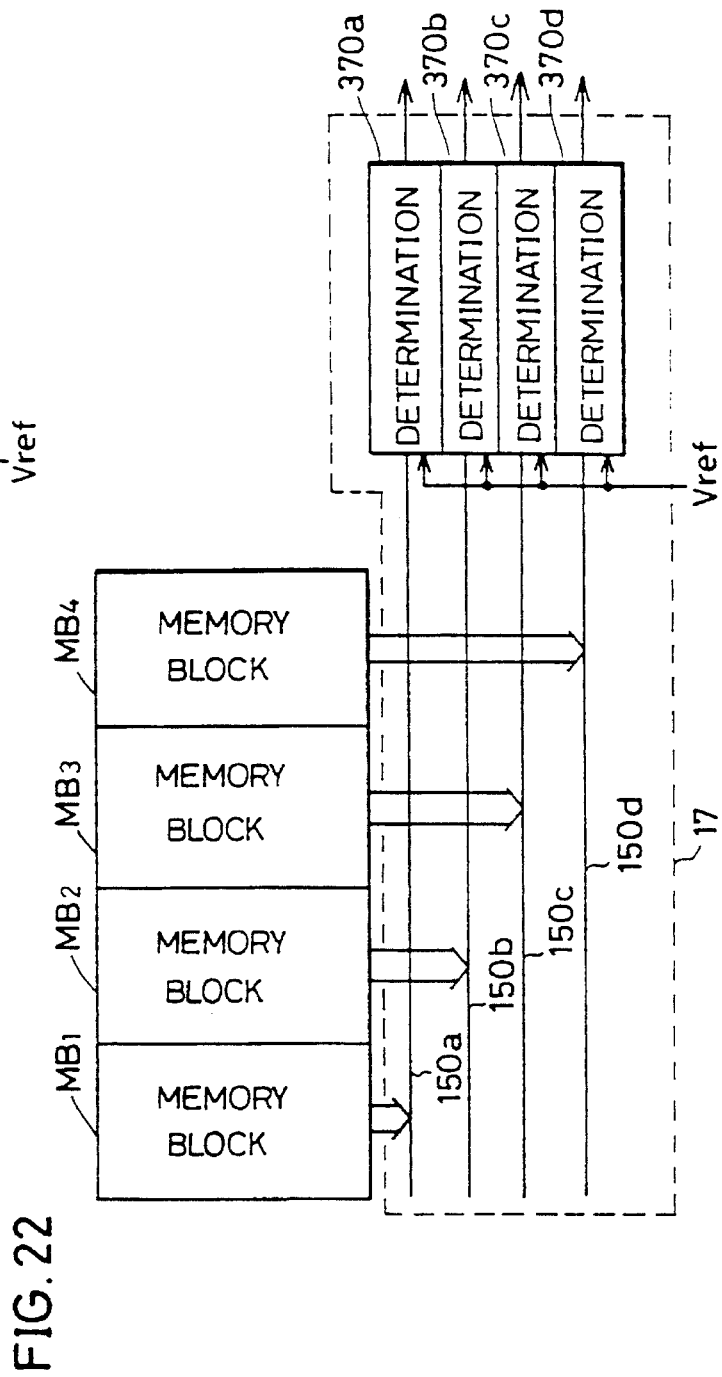
FIG. 22 shows an schematic structure in still another embodiment of the present invention.

Though the read out signal line is shown as one signal line to simplify the figures in FIGS. 21 and 22, in practice, it includes a pair of complementary signal lines. The data output circuit is also omitted here.

The data writing path and reading path are provided separately in the description above. However, in the circuit structure shown in FIG. 1, for example, test circuit 17 shown in FIG. 5 may be used in place of test circuit 118.

Figure 23:
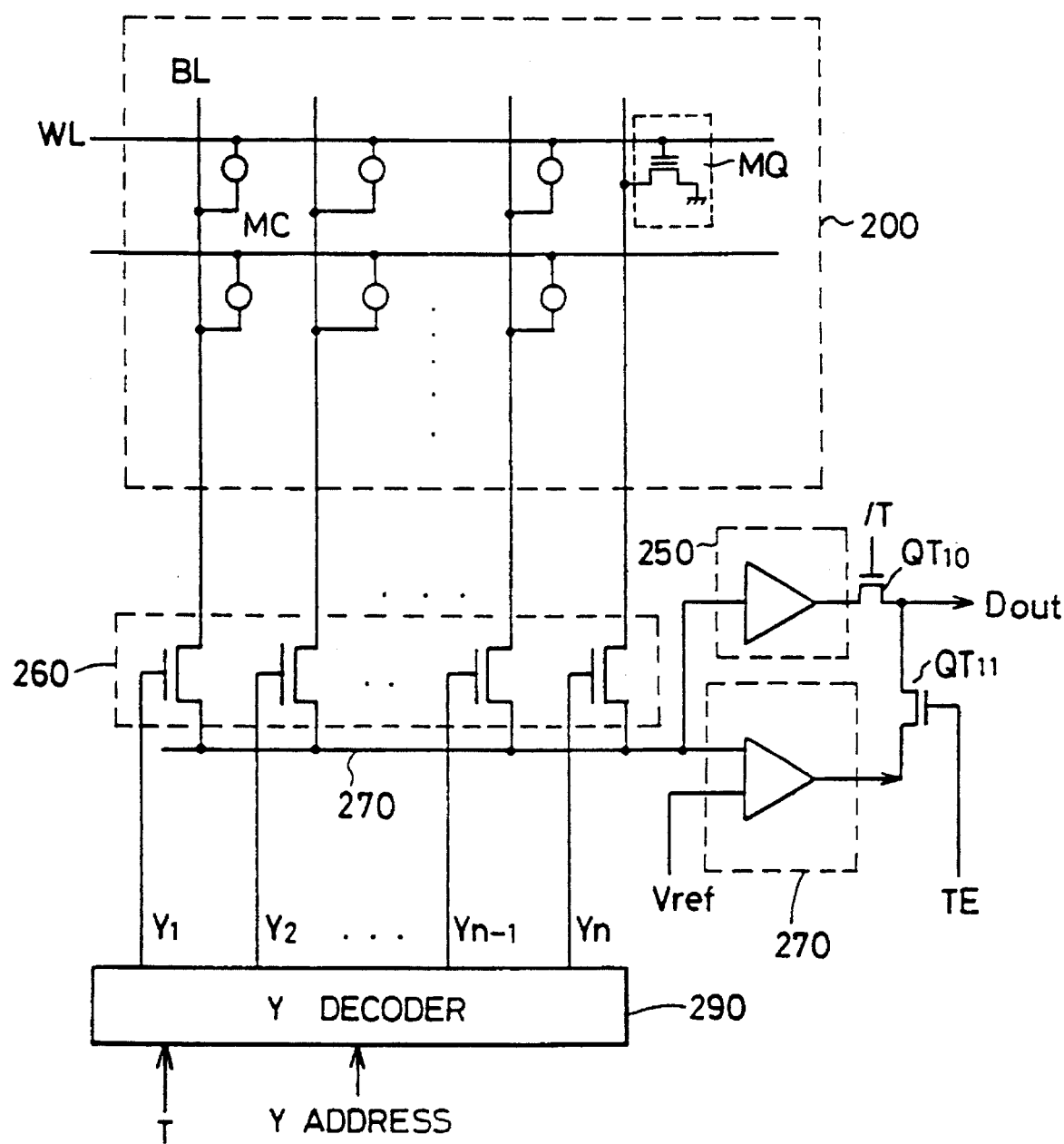
FIG. 23 schematically shows the structure of the main portion of a memory in yet another embodiment of the present invention.

One column includes a pair of bit lines in the memory device above. There is a memory device for storing data in a non-volatile manner, such as a programmable ROM. In the programmable ROM, as shown in FIG. 23, one bit line BL corresponds to one column. In the programmable ROM, it is necessary to conduct a test to see if all the memory cells MC are in an erased state before data programming. Particularly in the case of a user programmable ROM, it is necessary to conduct a test to see good/defective of memory cells in marketing the product. In this case, as shown in FIG. 23, if a determination circuit 270 is provided for an internal data transmission line 270, the test can be conducted at high speed. In the structure where data is read on a byte basis, determination circuit 270 may be provided for each bit of the byte, or the structure shown in FIG. 21 may be employed.

In FIG. 23, a selection transistor QT10 is turned off and a transistor QT11 is turned on at the time of the test mode. A Y decoder 290 connects a plurality of bit lines BL to internal data transmission line 270 through column select gate 260 in response to a test mode instructing signal T.

At the time of the normal mode, transistor QT10 is turned on, transistor TQ11 is turned off and the data is supplied through an output circuit 250.

In FIG. 23, a memory cell MC includes a floating gate type transistor MQ. In the case of a flash EEPROM cell, though the source of a memory transistor is connected to a source line, it is omitted to simplify the figure.

This structure is also applicable to an erase verify operation of PROM.

As stated above, according to the present invention, as it is so structured that the stored data of the plurality of memory cells are simultaneously transmitted to the read out data transmission line and a determination is made as to the presence or absence of a defective memory cell according to the relationship between the signal potential on the read out data transmission line and the reference potential at the time of the test mode, a semiconductor memory device can be obtained in which an arbitrary number of memory cells can be simultaneously tested without increasing the chip area and power consumption.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device capable of operating in a test operation mode, comprising:

a memory cell array including a plurality of memory cells arranged in a matrix of rows and columns, each memory cell capable of storing data;

a read data bus including a read out data transmission line for transmitting stored data read out from at least one memory cell selected within said memory cell array as a signal potential in both a normal mode and the test operation mode;

read out means responsive to an address at the time of said test operation mode for simultaneously selecting a plurality of memory cells from said memory cell array and then simultaneously transmitting the stored data of the selected plurality of memory cells onto said read out data transmission line as the signal potential; and determination means responsive to the signal potential on said read out data transmission line for making a determination as to whether there is a defective memory cell in the selected plurality of memory cells.

2. The semiconductor memory device according to claim 1, wherein said memory cell array includes column groups each containing a plurality of columns, and said read out means includes:

group designation means responsive to an applied address for designating one column group;

column designation means responsive to an applied address for designating a column in each of said column groups, said column designation means including setting means responsive to a test mode instructing signal for setting a plurality of columns to a selected state; and column selection means responsive to an output of said group designation means and an output of said column designation means for connecting a corresponding column of said memory cell array to said read out data transmission line.

3. The semiconductor memory device according to claim 1, wherein said read out means includes:

column designation means responsive to an applied address for generating a column designation signal for designating a corresponding column of said memory cell array, setting means for receiving an output of said column designation means and responsive to a test mode designation signal for setting thus received column designation signal so as to select all the columns; and means responsive to an output of said setting means for connecting a corresponding column of said memory cell array to said read out data transmission line.

4. The semiconductor memory device according to claim 1, wherein said memory cell array includes a plurality of column groups each including a plurality of columns, and said read out means includes means for selecting one column from each column group and connecting thus selected columns to said read out data transmission line at the time of the test operation mode.

5. The semiconductor memory device according to claim 1, wherein said memory cell array includes a plurality of column groups each including a plurality of columns, said read out data transmission bus includes a plurality of read out data transmission lines provided corresponding to each said column group, said determination means includes a plurality of determination means provided corresponding to each read out data transmission line, and said read out means includes means for selecting a plurality of columns from each column group and connecting thus selected columns to each corresponding read out data transmission line in the test operation mode.

6. The semiconductor memory device according to claim 1, further comprising:

column select means responsive to an applied address for generating column select signals for designating a corresponding column, a write data transmission line provided separately from said read out data transmission line for transmitting write data, and a write gate responsive to a write instructing signal and a column select signal for connecting said write data transmission line to a corresponding column of said memory cell array.

7. A semiconductor memory device capable of operating in a test operation mode, comprising:

a memory cell array including a plurality of memory cells arranged in a matrix of rows and columns, each memory cell capable of storing data;

a read data bus including a read out data transmission line for transmitting stored data read out from at least one memory cell selected within said memory cell array as a signal potential;

read out means responsive to an address at the time of said test operation mode for simultaneously selecting a plurality of memory cells from said memory cell array and then simultaneously transmitting the stored data of the selected plurality of memory cells onto said read out data transmission line as the signal potential; and determination means responsive to the signal potential on said read out data transmission bus for making a determination as to whether there is a defective memory cell in the selected plurality of memory cells, further comprising:

reference potential generating means for generating a reference potential;

precharge means for precharging said read out data transmission line to a prescribed potential; and a reference potential transmission line disposed substantially parallel to said read out data transmission line for transmitting the reference potential from said reference potential generating means to said determination means, said precharge means and said reference potential generating means being provided on one side of each of said read out data transmission line and said reference potential transmission line, and said determination means being provided on another side of each of said read out data transmission line and said reference potential transmission line and including means for comparing the reference potential and the signal potential on said read out data transmission line.

8. The semiconductor memory device according to claim 7, further comprising column select means responsive to an applied address for generating column select signals for designating corresponding columns, wherein said read out means includes read out gates provided corresponding to each column of said memory cell array, each read out gate being responsive to a column select signal from said column select means for transmitting data on a corresponding column to said read out data transmission line, each of said read out gates includes first coupling means responsive to data on a column and a corresponding column select signal for coupling said read out data transmission line to a first potential, and said reference potential generating means includes second coupling means for coupling said reference potential transmission line to said first potential, a current supply capability of said second coupling means being sufficiently smaller than the current supply capability of said first coupling means.

9. The semiconductor memory device according to claim 8, wherein said first coupling means includes a first switching element having a control gate connected to a corresponding column and one conduction terminal connected to said first potential, and a second switching element responsive to a column select signal for connecting another conduction terminal of said first switching element to said read out data transmission line.

10. The semiconductor memory device according to claim 8, wherein said first coupling means includes first switching elements each having a control gate connected to a different column in a pair and one conduction terminal connected to said read out data transmission line, and a second switching element responsive to a column select signal for connecting another conduction terminal of said first switching element to said first potential.

11. The semiconductor memory device according to claim 7, wherein said precharge means precharges the reference potential transmission line to the same potential as that of said read out data transmission line.

12. A semiconductor memory device capable of operating in a test operation mode, comprising:

a memory cell array including a plurality of memory cells arranged in a matrix of rows and columns, each memory cell capable of storing data;

a read data bus including a read out data transmission line for transmitting stored data read out from at least one memory cell selected within said memory cell array as a signal potential;

read out means responsive to an address at the time of said test operation mode for simultaneously selecting a plurality of memory cells from said memory cell array and then simultaneously transmitting the stored data of the selected plurality of memory cells onto said read out data transmission line as the signal potential; and determination means responsive to the signal potential on said read out data transmission line for making a determination as to whether there is a defective memory cell in the selected plurality of memory cells, wherein each column of said memory cell array includes a pair of first and second bit lines on which signals complementary to each other are transmitted, said read out data transmission line includes a pair of complementary first and second read out data transmission lines, and said determination means includes:

first comparison means for comparing a potential on said first read out transmission line and a reference potential;

said comparison means for comparing a potential on said second read out data transmission line and said reference potential; and detection means for detecting a coincidence/non-coincidence between an output of said first comparison means and an output of said second comparison means.

13. A semiconductor memory device capable of operating in a normal operation mode and a test operation mode, comprising:

a memory cell array including a plurality of memory cells arranged in a matrix of rows and columns, each memory cell capable of storing data;

a write data transmission line for transmitting data to be stored in at least one memory cell within said memory cell array;

a read out data transmission line provided separately from said write data transmission line for transmitting stored data read out from the at least one memory cell within said memory cell array as a signal potential;

amplifying means for amplifying the signal potential on said read out data transmission line;

read out means responsive to an address for simultaneously selecting a plurality of memory cells from said memory cell array and then simultaneously transmitting the stored data of the selected plurality of memory cells to said read out data transmission line as the signal potential in said test operation mode, said read out means selecting one memory cell from said memory cell array in response to an external address and transmitting the stored data of the selected memory cell to said read out data transmission line as the signal potential in said normal operation mode;

determination means responsive to the signal potential on said read out data transmission line for making a determination as to whether there is a defective memory cell in the selected plurality of memory cells in said test operation mode; and selection means for selectively passing and supplying one of the output of said amplifying means and the output of said determination means, said selection means selecting the output of said amplifying means at the time of said normal operation mode and selecting the output of said determination means at the time of said test operation mode.

14. A semiconductor memory device capable of operating in a normal operation mode and a test operation mode, comprising:

a memory cell array including a plurality of memory cells arranged in a matrix of rows and columns, each memory cell capable of storing data;

a write data transmission line for transmitting data to be stored in at least one memory cell within said memory cell array;

a read out data transmission line provided separately from said write data transmission line for transmitting stored data read out from the at least one memory cell within said memory cell array as a signal potential;

amplifying means for amplifying the signal potential on said read out data transmission line;

read out means responsive to an address for simultaneously selecting a plurality of memory cells from said memory cell array and then simultaneously transmitting the stored data of the selected plurality of memory cells to said read out data transmission line as the signal potential in said test operation mode, said read out means selecting one memory cell from said memory cell array in response to an external address and transmitting the stored data of the selected memory cell to said read out data transmission line as the signal potential in said normal operation mode;

determination means responsive to the signal potential on said read out data transmission line for making a determination as to whether there is a defective memory cell in the selected plurality of memory cells in said test operation mode;

selection means for selectively passing and supplying one of the output of said amplifying means and the output of said determination means, said selection means selecting the output of said amplifying means at the time of said normal operation mode and selecting the output of said determination means at the time of said test operation mode;

means for generating a reference potential;

a reference potential transmission line disposed substantially parallel to said read out data transmission line for transmitting the reference potential from said reference potential generating means to said determination means for comparison reference thereat; and precharge means for precharging said read out data transmission line to a prescribed precharge potential, said precharge means and said reference potential generating means being provided on one side of said read out data transmission line and said reference potential transmission line and said determination means being provided on the side opposite to said one side of said read out data transmission line and said reference potential transmission line.

15. The semiconductor memory device according to claim 14, wherein said precharge means precharges said reference potential transmission line to the same precharge potential as that of said read out data transmission bus, said read out means includes first discharge means provided corresponding to each column for discharging said precharge potential of said read out data transmission line to a first potential when selected, and said reference potential generating means includes second discharge means for discharging said precharge potential of said reference potential transmission line to said first potential, the discharging rate of said second discharge means being smaller than the discharging rate of said read out data transmission line by said first discharge means when one column is connected to said reference potential transmission line.

16. In a semiconductor memory device operable in a test mode and a normal operation mode, and including an array of memory cells arranged in rows and columns with each memory cell storing data, and a read out data bus including at least one read out data transmission line, a method of operating said semiconductor memory device during said test mode to determine whether the device is good or defective, comprising the steps of:

simultaneously selecting a plurality of memory cells within said array and then simultaneously transmitting data thereof to said read out data transmission line as a signal potential at the time of the test;

in response to the potential on said read out data transmission line, supplying a signal indicating whether or not there is a defective memory cell included in the selected plurality of memory cells, wherein data of one memory cell is transmitted to said read out data transmission line at the time of the normal operation mode of said semiconductor memory device.

17. The method according to claim 16, further comprising a step of precharging said read out data transmission line to a prescribed potential, said step of simultaneously transmitting data including a step of discharging or maintaining the precharge prescribed potential of said read out data transmission line in response to the data of said selected plurality of memory cells.

18. The method according to claim 17, wherein said memory device further includes a reference potential transmission line for transmitting a reference potential, and said step of supplying includes the steps of:

precharging said reference potential transmission line to the precharge prescribed potential;

discharging the precharge prescribed potential of said reference potential transmission line at a discharging rate slower than the discharging rate on said read out data transmission line in said step of discharging or maintaining the precharge prescribed potential, and comparing the potential on said reference potential transmission line and the potential on said read out data transmission line.

19. The method according to claim 17, wherein each of said columns includes a pair of bit lines on which data complementary to each other are transmitted, said read out data transmission bus includes first and second read out data transmission lines corresponding to said one pair of bit lines, and said step of supplying includes the steps of:

discharging the reference potential transmission line at a predetermined rate, comparing the potential on said first read out data transmission line and the potential on said reference potential transmission line and generating a first comparison result;

comparing the potential on said second read out data transmission line and the potential on said reference potential transmission line and generating a second comparison result; and detecting a coincidence/non-coincidence between said first and second comparison results.

* * * * *